(12) United States Patent
Suhara

(10) Patent No.: US 9,069,023 B2
(45) Date of Patent: Jun. 30, 2015

(54) LATENT-IMAGE MEASURING DEVICE AND LATENT-IMAGE CARRIER

(75) Inventor: Hiroyuki Suhara, Kanagawa (JP)

(73) Assignee: RICOH COMPANMY, LIMITED, Tokyo (JP)

( * ) Notice: Subject to any disclaimer, the term of this patent is extended or adjusted under 35 U.S.C. 154(b) by 526 days.

(21) Appl. No.: 13/591,783

(22) Filed: Aug. 22, 2012

(65) Prior Publication Data

US 2012/0321349 A1 Dec. 20, 2012

Related U.S. Application Data

(62) Division of application No. 11/866,758, filed on Oct. 3, 2007, now Pat. No. 8,314,627.

(30) Foreign Application Priority Data

Oct. 13, 2006 (JP) .................................. 2006-280105
Jan. 15, 2007 (JP) .................................. 2007-006267

(51) Int. Cl.
*G01R 29/14* (2006.01)
*G03G 15/00* (2006.01)

(52) U.S. Cl.
CPC ................ *G01R 29/14* (2013.01); *G03G 15/75* (2013.01)

(58) Field of Classification Search
CPC .................... G03G 15/18; G03G 5/02; G03G 2215/00054; G03G 15/75; G01R 29/14; G01R 29/24

See application file for complete search history.

(56) References Cited

U.S. PATENT DOCUMENTS

| | | | |
|---|---|---|---|
| 4,847,496 A * | 7/1989 | Kamieniecki | 250/315.3 |
| 5,614,713 A | 3/1997 | Kobaru et al. | |
| 6,081,386 A | 6/2000 | Hayashi et al. | |
| 6,329,826 B1 | 12/2001 | Shinada et al. | |
| 6,376,837 B1 | 4/2002 | Itabashi et al. | |
| 6,999,208 B2 | 2/2006 | Suzuki et al. | |
| 7,122,796 B2 | 10/2006 | Hiroi et al. | |
| 7,239,148 B2 | 7/2007 | Suhara | |
| 7,400,839 B2 | 7/2008 | Suhara | |
| 7,612,570 B2 | 11/2009 | Suhara | |
| 7,783,213 B2 | 8/2010 | Suhara | |

(Continued)

FOREIGN PATENT DOCUMENTS

| | | |
|---|---|---|
| JP | 3-49143 | 3/1991 |
| JP | 2002-113903 | 4/2002 |

(Continued)

OTHER PUBLICATIONS

Japanese Office Action issued on Jun. 7, 2011 in corresponding Japanese Application No. 2007-006267.

(Continued)

*Primary Examiner* — Tung X Nguyen
(74) *Attorney, Agent, or Firm* — Oblon, McClelland, Maier & Neustadt, L.L.P.

(57) ABSTRACT

A latent-image measuring device that measures the state of a photoconductor. The latent-image measuring device emits a charged-particle beam to the photoconductor to detects a charged-particle signal obtained through the emission of the charged-particle beam. The latent-image measuring device then exposes the photoconductor a plurality of times to form electrostatic latent images on the photoconductor, and measures an amount of change in latent-image depth while changing a time interval between a plurality of exposures.

2 Claims, 24 Drawing Sheets

(56) References Cited

U.S. PATENT DOCUMENTS

| | | |
|---|---|---|
| 7,869,725 B2 | 1/2011 | Suhara |
| 8,314,627 B2 * | 11/2012 | Suhara ................. 324/754.22 |
| 2005/0162499 A1 | 7/2005 | Sugiyama et al. |

FOREIGN PATENT DOCUMENTS

| | | |
|---|---|---|
| JP | 2003-241403 | 8/2003 |
| JP | 2003-295696 | 10/2003 |
| JP | 2005-166542 | 6/2005 |
| JP | 2005-212195 | 8/2005 |
| JP | 2005-221935 A | 8/2005 |
| JP | 2006-344436 | 12/2006 |

OTHER PUBLICATIONS

Office Action issued Jan. 17, 2012, in Japanese Patent Application No. 2006-280105.
Japanese Office Action issued Mar. 6, 2012, in Patent Application No. 2007-006267.

* cited by examiner

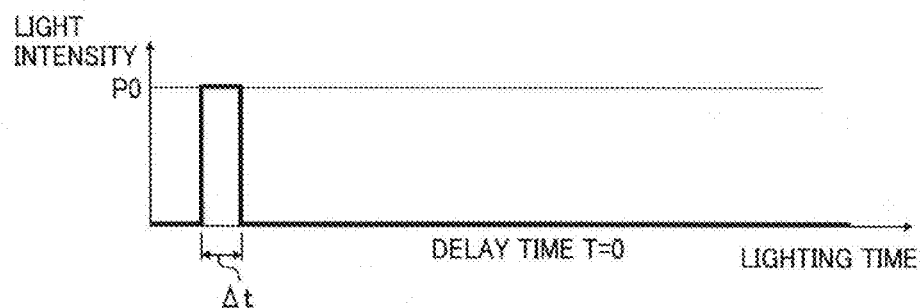
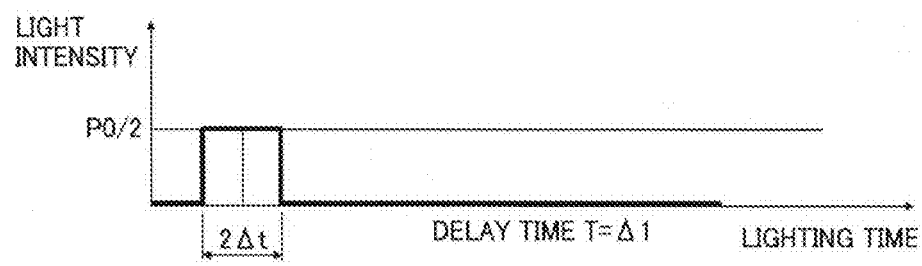
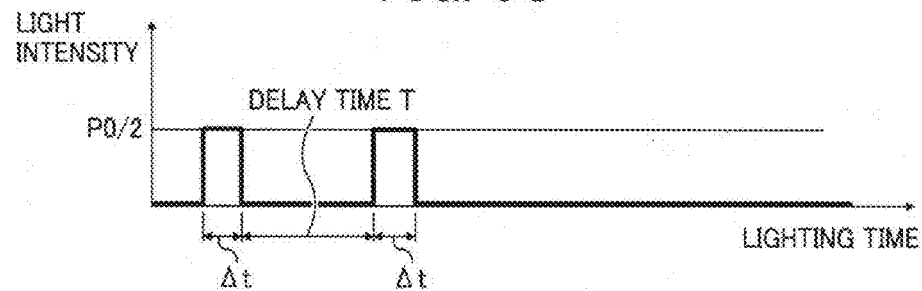
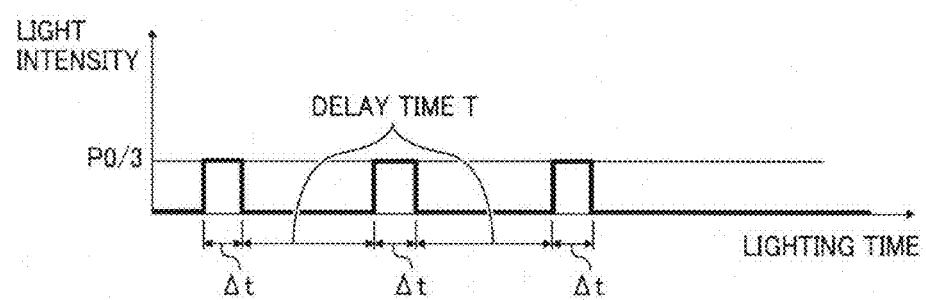

LATENT-IMAGE
DIAMETER D

LATENT-IMAGE MEASURING DEVICE AND LATENT-IMAGE CARRIER

CROSS-REFERENCE TO RELATED APPLICATIONS

The present application is a divisional application of U.S. Ser. No. 11/866,758 filed Oct. 3, 2007, now U.S. Pat. No. 8,314,627 which claims priority to Japanese priority document, 2006-280105 filed in Japan on Oct. 13, 2006, and Japanese priority document, 2007-6267 filed in Japan on Jan. 15, 2007, the entire contents of each of which are incorporated herein by reference.

BACKGROUND OF THE INVENTION

1. Field of the Invention

The present invention relates to a latent-image measuring device, and a latent-image carrier.

2. Description of the Related Art

For example, Japanese Patent Application Laid-open No. H03-49143 has proposed a conventional method of observing an electrostatic latent image using electron beams. In the conventional method, however, samples for use in forming an electrostatic latent image thereon are limited to large-scale-integration (LSI) chips and those that can store and hold an electrostatic latent image. That is, an ordinary photoconductor having dark attenuation characteristics cannot be used as a sample. Because the ordinary dielectric substance can semi-permanently hold an electric charge, when an electric charge distribution is measured after its formation, there is no influence in the measurement result. On the other hand, in the case of the photoconductor, because the resistance value is not limitless, the photoconductor cannot hold an electric charge for a long time, and the surface potential decreases along lapse of time due to the dark attenuation characteristics. That is, the photoconductor holds an electric charge for only some seconds in a dark room. Therefore, even when an electrostatic latent image is attempted to be observed with a scanning electron microscope (SEM) after charging and exposure, the electrostatic latent image disappears at the preparation stage.

To overcome the problem, for example, Japanese Patent Application Laid-open No. H2003-295696 has proposed a method of measuring an electrostatic latent image formed on a photoconductor as a sample having dark attenuation.

FIGS. 20A and 20B are schematic diagrams for explaining charge-distribution/potential-distribution detection using secondary electrons.

When charge distribution is present on the surface of the sample, an electric field distribution is spatially formed according to the surface charge distribution. Therefore, generated secondary electrons e are pushed back by incident electrons (not shown), and the amount of the secondary electrons e that reach a detector S decreases.

In the example of FIGS. 20A and 20B, light is irradiated onto a point on the surface of the photoconductor sample that is uniformly negatively charged with a charge density Q, and thus, charge density locally decreases. For example, secondary electrons e1 and e2 generated by incident electrons that reach a position P1 and a position P2 are pulled in a direction of the detector S forming an antipole, and reach the detector S drawing flight trajectories G1 and G2, respectively. On the other hand, when an incident electron reaches a position indicated by P3, for example, a generated secondary electron e3 once flies out from the surface of the sample. However, because a relatively opposite direction of an electric field distribution is formed at this position, force is generated toward the surface of the sample to return the secondary electron e3 back as indicated by a flight trajectory G3. Therefore, the secondary electron e3 is absorbed into the surface of the sample, and does not reach the detector S.

Accordingly, a part of the surface of the sample having strong electric field intensity is dark, and a part having weak electric field intensity is bright, generating a contrast of brightness. As a result, a contrast image according to the surface charge distribution can be detected. Consequently, when the surface is exposed, the exposed part becomes black, and a non-exposed part becomes white, thereby forming an electrostatic latent image which can be measured.

FIG. 21 is a chart for explaining reciprocity failure.

A photoconductor has the occurrence of a phenomenon of reciprocity failure that even when the total exposure energy given to the photoconductor is the same, when a relation between the light intensity and the exposure time is different, a latent-image formation state is different. In general, when the exposure energy is constant, and when light intensity is strong (when the exposure time is short), sensitivity (depth of the latent image) decreases. As a result, image density is differentiated. This is considered to occur because of a phenomenon that when the light intensity is strong, the amount of recombined carriers increases, and the amount of carriers reaching the surface decreases. When a multi-beam scanning optical system is used, this phenomenon remarkably appears as uneven image density.

FIG. 22 is a schematic diagram for explaining image density when a 4-ch LD array is used as the scanning optical system of the image forming apparatus.

A boundary area of LD1 and LD2 is exposed substantially simultaneously. Therefore, large amount of light is applied to this area in a short time. On the other hand, in a boundary area of LD4 and LD1, LD4 is exposed first, and then LD1 is exposed. Therefore, a time difference occurs, and weak light intensity is applied during a long time as a result. In this case, when exposure is carried out in a long delay time, a deep latent-image potential distribution is formed, and a toner can easily adhere to the surface. As a result, the boundary area of LD4 and LD1 has high image density, and uneven image density occurs.

FIG. 23 is an enlarged view of a photoconductor surface. The phenomenon of reciprocity failure depends on a charge-generation-layer (CGL) film thickness, carrier mobility, quantum efficiency, and a generation amount of carriers, among characteristics of a photoconductor. Therefore, it is desirable to provide an imaging system including a photoconductor that does not easily generate reciprocity failure, and a scanning optical system. However, according to the conventional measuring method, space resolution of only about a few millimeters can be obtained, and sufficient precision cannot be obtained to analyze the mechanism.

When charge distribution is present on the surface of the sample, an electric field distribution according to the surface charge distribution is spatially formed. Therefore, a secondary electron generated by the incident electron is returned back by this electric field, and the amount of the secondary electrons reaching the detector decreases. Accordingly, a part having strong light intensity is dark, and a part having weak light intensity is bright, thereby generating a contrast of brightness, making it possible to detect a contrast image according to the surface charge distribution. Therefore, when light is irradiated, the exposed part becomes black, and the non-exposed part becomes white, thereby making it possible to measure an electrostatic latent image formed (see FIGS. 20A and 20B).

A photoconductor has the occurrence of a phenomenon of reciprocity failure that even when the total exposure energy given to the photoconductor is the same, when a relation between the light intensity and the exposure time is different, a latent-image formation state is different. In general, when the exposure energy is constant, and when light intensity is strong, sensitivity (depth of the latent image) decreases. As a result, image density is differentiated (see FIG. 21). This is considered to occur because of the phenomenon that when the light intensity is strong, the amount of recombined carriers increases, and the amount of carriers reaching the surface decreases. When a multi-beam scanning optical system is used, this phenomenon conspicuously appears as uneven image density.

The phenomenon of reciprocity failure depends on a CGL film thickness, carrier mobility, quantum efficiency, and the generation amount of carriers, among characteristics of a photoconductor. Therefore, it is desirable to provide an imaging system including a photoconductor that does not easily generate reciprocity failure, and a scanning optical system. However, according to the conventional measuring method, space resolution of only about a few millimeters can be obtained, and sufficient precision cannot be obtained to analyze the mechanism.

Furthermore, mobility of carriers generated by laser beams or by light-emitting-diode (LED) exposure is calculated using a time-of-flight method for calculating a time in which a carrier generated at the sample side moves to the opposite surface. However, the CGL is a thin film of about 0.1 micrometer, and cannot obtain sufficient precision. A moving speed and a moving time of a carrier give large influence to the formation of a latent image, and are very important factors to obtain high image quality.

SUMMARY OF THE INVENTION

It is an object of the present invention to at least partially solve the problems in the conventional technology.

According to an aspect of the present invention, a latent-image measuring device that measures an electrostatic latent image formed on a sample, includes an emitting unit that emits a charged-particle beam to the sample; a detecting unit that detects a charged-particle signal obtained through emission of the charged-particle beam; a charge-distribution measuring unit that measures charge distribution on the sample; and an optical system that exposes the sample a plurality of times to form the electrostatic latent image on the sample.

According to another aspect of the present invention, a latent-image carrier, having a surface that is uniformly charged and exposed to form an electrostatic latent image thereon, satisfies, when the surface is exposed a plurality of times to light beams having a wavelength equal to or less than 680 nanometers, $|\Delta D/A|<0.2$, where A is a diameter of a beam spot on the surface and is equal to or less than 60 micrometers, and $\Delta D$ is a difference in latent-image diameter corresponding to the beam spot between when a time interval at which the surface is exposed is 1 microsecond and when the time interval is 1 millisecond.

According to still another aspect of the present invention, a latent-image carrier, having a surface that is uniformly charged and exposed to form an electrostatic latent image thereon, satisfies, when the surface is exposed a plurality of times to light beams having a wavelength equal to or less than 680 nanometers under conditions that a diameter of a beam spot on the surface is equal to or less than 60 micrometers, and that exposure energy density is equal to or less than 4 mJ/m², $|\Delta Vpv/Vd|<0.1$, where Vd is a potential to which the surface is charged, and $\Delta Vpv$ is a difference in latent-image depth corresponding to the beam spot between when a time interval at which the surface is exposed is 1 microsecond and when the time interval is 1 millisecond.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIGS. 3A to 3D are examples of light emitting patterns of an LD shown in FIG. 2;

DETAILED DESCRIPTION OF THE PREFERRED EMBODIMENTS

Exemplary embodiments of the present invention are explained in detail below with reference to the accompanying drawings.

As is well known, surface charges are spatially localized in a sample. In the following description, surface charge indicates the state that electric charges are distributed larger in the in-plane direction compared with the thickness direction. The electric charges include ions as well as electrons. A conductor can be arranged on the surface of a sample to generate potential distribution on the surface or its vicinity by applying a voltage to the conductive part.

Figure 1:
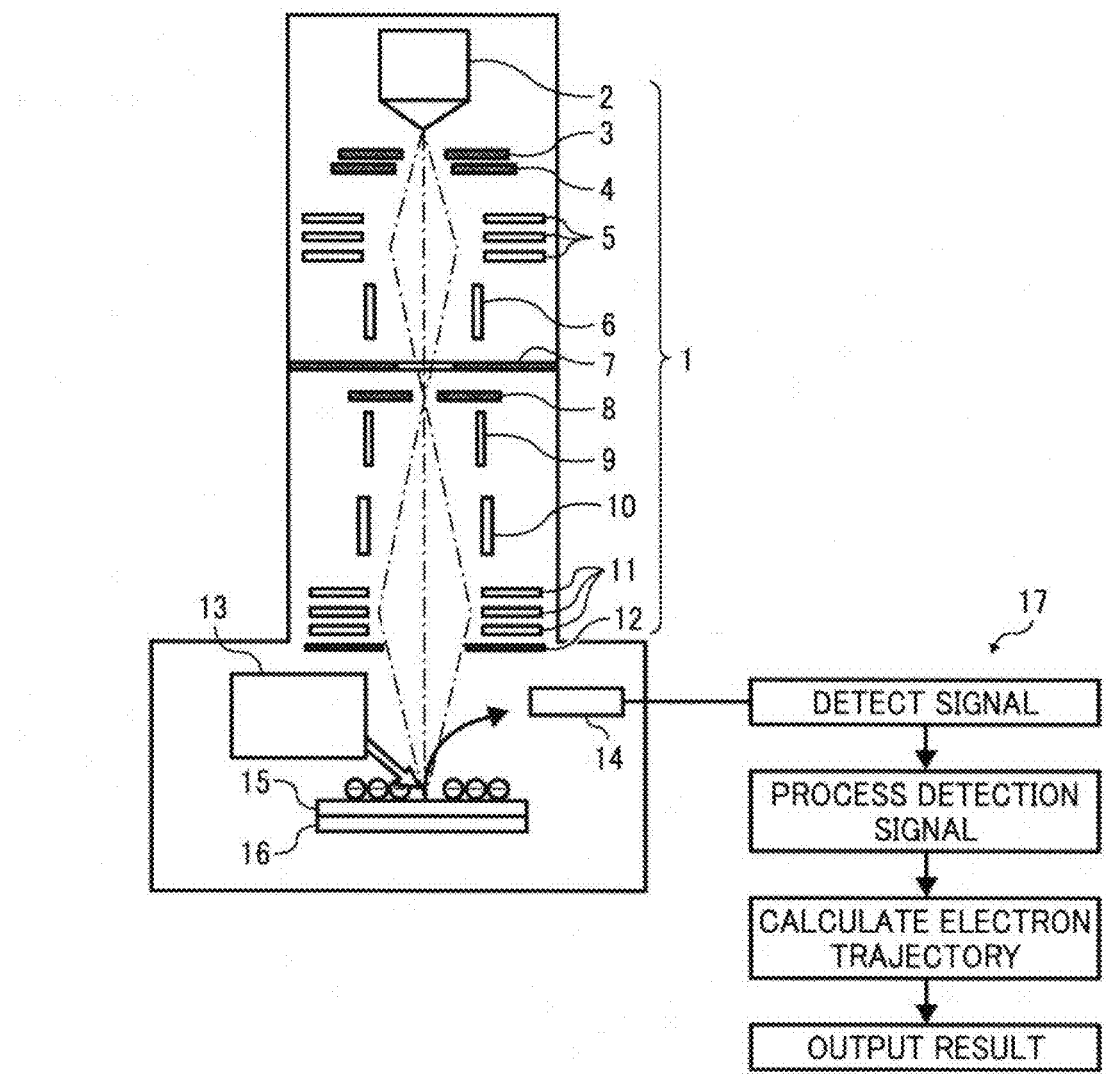
FIG. 1 is a schematic diagram of a surface-potential-distribution measuring device as a latent-image measuring device according to a first embodiment of the present invention.

FIG. 1 is a schematic diagram of a surface-potential-distribution measuring device as a latent-image measuring device according to a first embodiment of the present invention.

The surface-potential-distribution measuring device includes a charged-particle emitting unit 1, an exposure optical system 13, a sample setting unit 16 made of a conductor, and a detector 14 that detects primary inverse-charged particles and secondary electrons and sends them to a signal processor 17.

The charged-particle emitting unit 1 emits charged-particle beams. The charged particles include particles that receive the influence of the electric field and magnetic field such as electron beams or ion beams.

The charged-particle emitting unit 1 includes an electron gun 2, an extracting electrode (extractor) 3, an acceleration electrode 4, a condenser lens (electrostatic lens) 5, a beam blanker (beam blanking electrode) 6, a partition 7, a variable diaphragm 8, an astigmatic correction (stigmator) 9, a scanning lens (deflecting electrode) 10, an electrostatic lens (objective lens) 11, and a beam-emission opening 12.

The electron gun 2 generates electron beams. The extracting electrode 3 controls electron beams. The acceleration electrode 4 controls energy of electron beams. The condenser lens 5 converges the electron beams from the electron gun 2. The beam blanker 6 turns on and off electron beams. Electron beams that have passed through the beam blanker 6 also passes through the scanning lens 10, and travel to the objective lens 11 as scanning beams. The objective lens 11 converges the scanning beams. The charged-particle emitting unit 1 further includes an aperture (not shown) that controls the irradiation current of electron beams. The lenses, etc. are connected to a driving power source (not shown).

In the case of the ion beams, a liquid metal ion gun is used in place of the electron gun.

Figure 2:
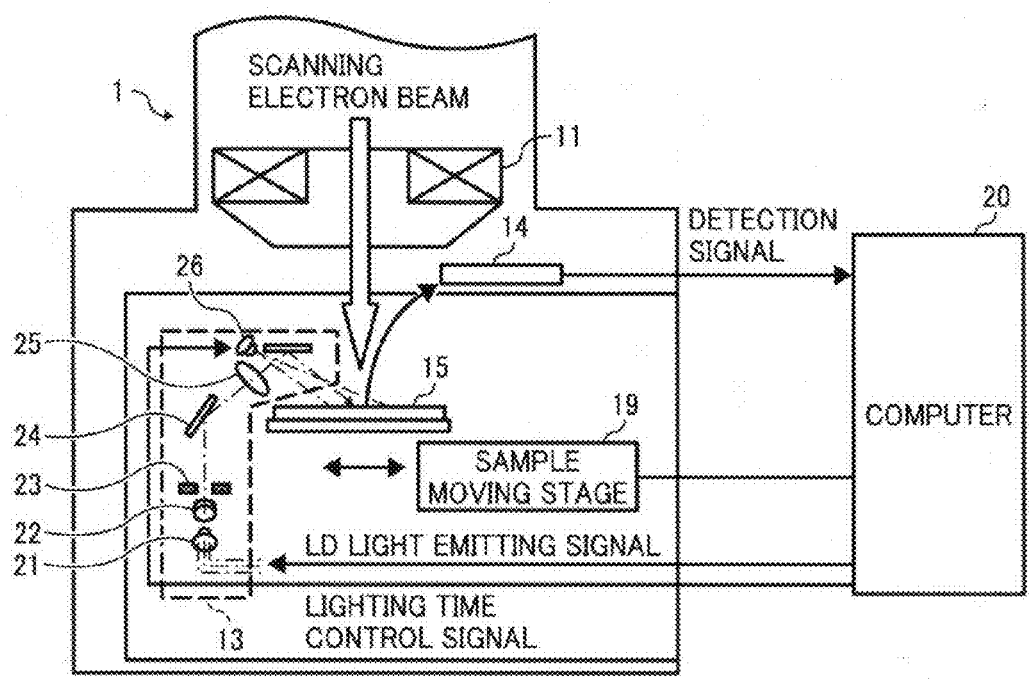
FIG. 2 is a schematic diagram of an exposure optical system shown in FIG. 1.

FIG. 2 is a schematic diagram of the exposure optical system 13. The exposure optical system 13 includes a laser diode (LD) 21, a collimate lens 22, an aperture 23, a mirror 24, a condenser lens 25, and an ionizing LED 26. The LD 21 serves as a light source having sensitivity for a photoconductor (latent-image carrier) 15 as a sample. The exposure optical system 13 can generate a desired beam diameter, and a beam profile on the photoconductor 15. An LD control unit 20 such as a computer is used to irradiate exposure energy during a suitable exposure time.

FIGS. 3A to 3D depict examples of light emitting patterns of the LD 21. FIG. 3A is a pattern for exposure during time $\Delta t$ at light intensity P0. FIG. 3B is a pattern for exposure during time $2\Delta t$ at light intensity P0/2. FIG. 3C is a pattern for twice of exposures during time $\Delta t$ with an interval at light intensity P0/2. FIG. 3D is a pattern for three times of exposures during time $\Delta t$ at light intensity P0/3.

FIGS. 3A and 3B each depict a light emitting pattern for one exposure with constant exposure energy per unit area of the sample at different light intensity during different irradiation time. FIG. 3C depicts a light emitting pattern for two exposures including first exposure and second exposure after a delay time T(s).

The same optical system is used, and other conditions than the LD-light emitting patterns are the same. That is, the same area is exposed repeatedly a plurality of times.

It can be seen that delay time is zero in the emitting pattern shown in FIG. 3A, and delay time is $\Delta t$ in the emitting pattern shown in FIG. 3B. While the exposure energy per unit area of the sample is constant for the emitting patterns shown in FIGS. 3A to 3D, states of latent images are different due to the influence of reciprocity failure. The influence of reciprocity failure can be measured by measuring a change of latent-image depth during a delay time of a plurality of pulses.

Figure 23:
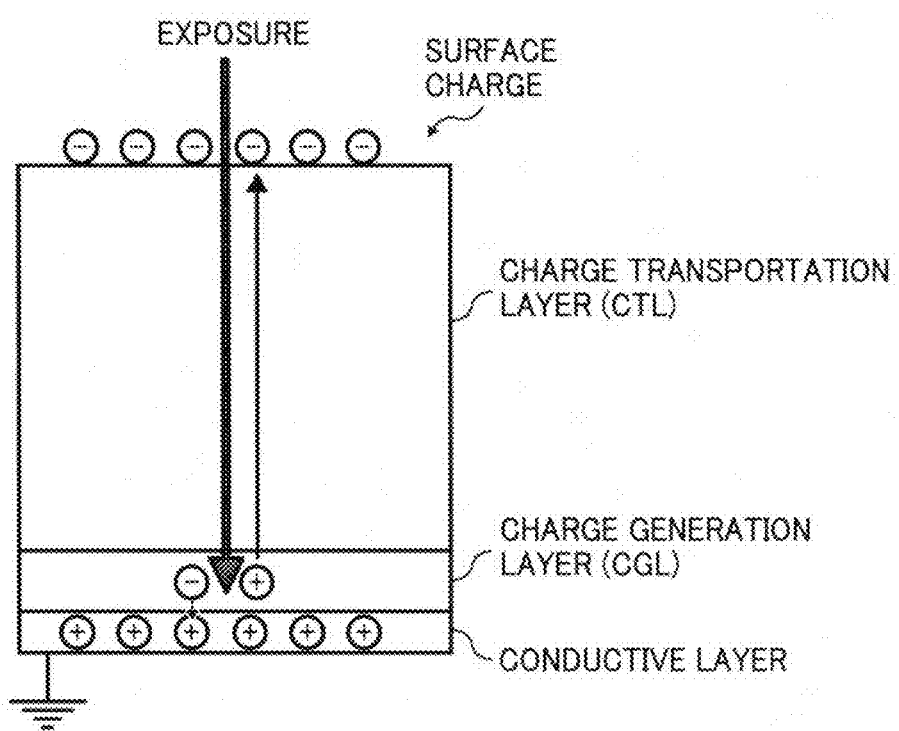
FIG. 23 is an enlarged view of a photoconductor surface.

As explained in connection with FIG. 23, the reciprocity failure has a correlation with the recombination of charges generated in the CGL, and depends on carrier moving time in the CGL.

The moving time of carriers in the CGL is different depending on the sample, and is within the range of $10^{-6}$ to $10^{-4}$ seconds. In the case of an ordinary photoconductor, the moving time is around 10 microseconds. When the moving time is equal to or shorter than 10 nanoseconds, simultaneous lighting can be considered to occur.

When the moving time is equal to or more than 1 microsecond, movement of carriers is almost completed, and no difference of contrast is observed. Therefore, to confirm the influence of the reciprocity failure, it is desirable to give a delay time of 10 nanoseconds or more.

A plurality of light sources can be also superimposed. A latent-image pattern can be formed by scanning with light of a plurality of light sources, and a latent-image formation state can be evaluated.

Figure 4A:
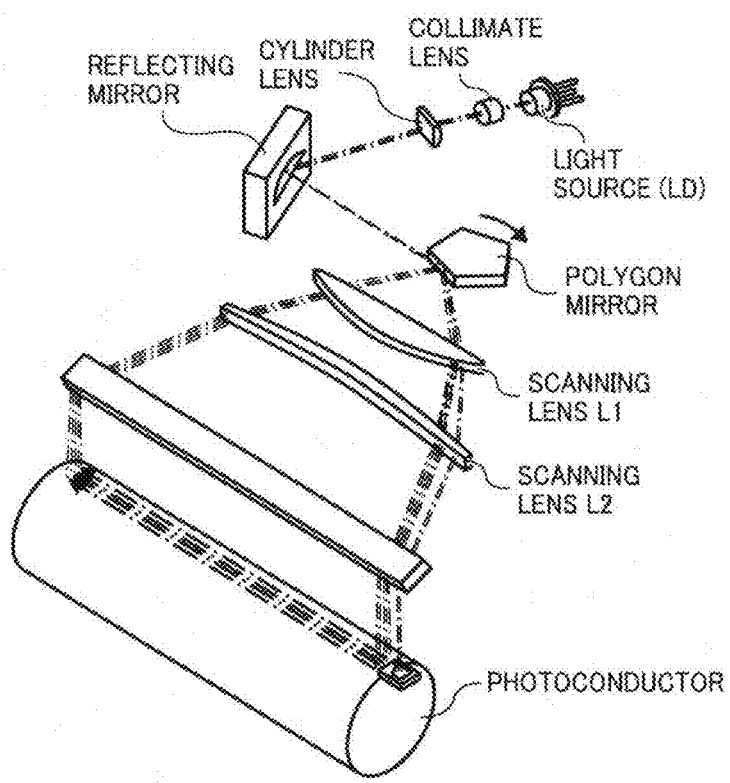
FIG. 4A is another schematic diagram of the exposure optical system.
Figure 4B:
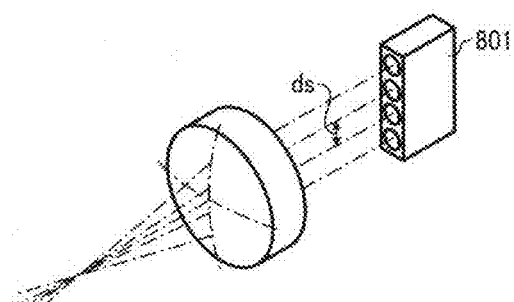
FIG. 4B is an example of a semiconductor laser array having four light sources that is arranged in the vertical direction of the optical axis of a collimate lens shown in FIG. 4A.
Figure 4C:
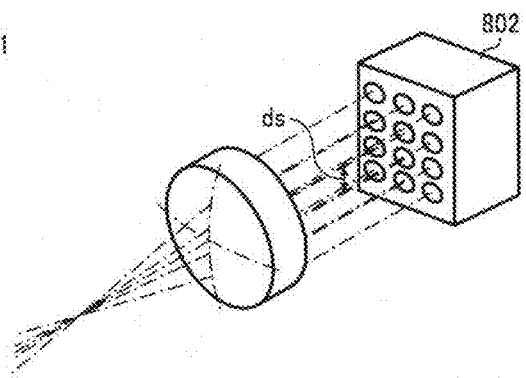
FIG. 4C is a schematic diagram of a light source of the optical scanning device including a surface light-emitting laser with light emitting points arranged in the X-axis direction and the Y-axis direction.

FIGS. 4A to 4C depict one example of the exposure optical system 13.

A plurality of light sources are used to form a pattern of lines. A scanning mechanism using a galvano mirror or a polygon mirror is added to the optical system. With this, beam scanning can be carried out to dynamically measure latent-image state.

The operation of the exposure optical system 13 is explained next. First, electron beams are irradiated onto the photoconductor (sample) 15. An acceleration voltage |Vacc| is set higher than the acceleration voltage at which a secondary-electron emission rate becomes one. With this arrangement, the amount of incident electrons exceeds the amount of discharge electrons, and therefore, electrons are accumulated in the sample 15, generating a charge up. As a result, the sample 15 can generate a uniform minus charging. A desired charge potential can be formed, by suitably setting the acceleration voltage and the irradiation time.

Next, the exposure optical system 13 exposes the photoconductor 15. The exposure optical system 13 is adjusted to form a desired beam diameter and a desired beam profile.

Necessary exposure energy is a factor determined based on photoconductor characteristics, and is usually about 2 to 6 mJ/m². A photoconductor of low sensitivity requires several dozens of mJ/m² in some cases. The charge potential and the necessary exposure energy can be set to match the photoconductor characteristics and process conditions.

As a result, an electrostatic latent image can be formed on the photoconductor 15.

Thereafter, the amount of incident electrons is decreased to change the mode to an observation mode.

Figure 5A:
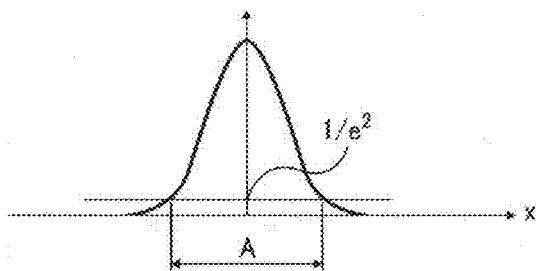
FIGS. 5A to 5C are charts for explaining a relation between a beam-spot diameter and a latent-image diameter.
Figure 5B:
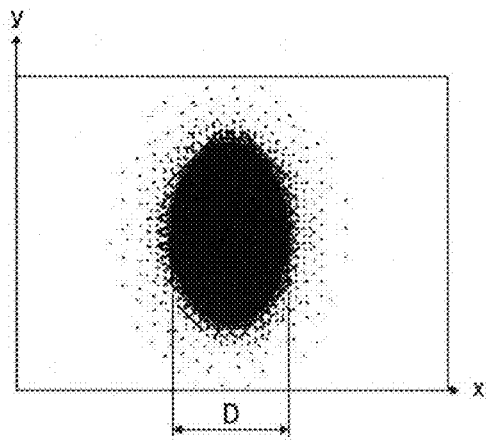
Figure 5C:
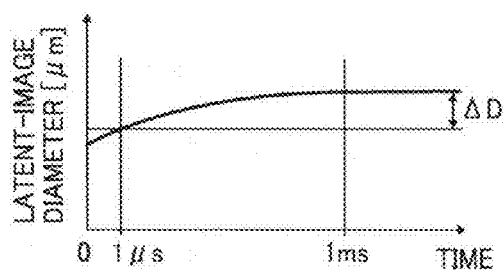

FIGS. 5A to 5C depict a relation between a beam-spot diameter and a latent-image diameter. FIG. 5A depicts a latent-image forming area. FIG. 5B is a profile of a cross section of a beam. FIG. 5C is a chart of a relation between the exposure time and the latent-image diameter.

The photoconductor 15 is scanned with electron beams. The detector 14 detects the discharged secondary electrons, and converts the detected secondary electrons into an electric signal, thereby observing a contrast image.

With this, the charged part has a large amount of detected secondary electrons, and the exposed part has a small amount of detected secondary electrons, thereby generating a contrast image of brightness. A dark part can be regarded as a latent image part based on the exposure. Therefore, a boundary of contrast when a spot exposure is carried out without scanning with light beams can be set as a latent-image diameter D of one beam-spot latent image.

Assume that a wavelength of a writing light source is equal to or less than 680 nanometers, and a beam-spot diameter ($1/e^2$ diameter) on the photoconductor surface is A. When the beam-spot diameter A is equal to or less than 60 micrometers, and when a change amount of one beam-spot latent image is ΔD (micrometer) when delay time of two exposures is 1 microsecond and 1 millisecond, the change of the latent-image diameter is desirably small.

In the condition of $|\Delta D/A| \geq 0.2$, the adhesion amount of a toner is different, and there is a risk of the occurrence of uneven image density. In the ordinary image forming apparatus, the beam-spot diameter is permitted to change within ±10%. That is, the range of 20% is permitted.

When $|\Delta D/A| < 0.2$, the influence of reciprocity failure is small, and the photoconductor can obtain high image quality, and can be regarded satisfactory.

Figure 6:
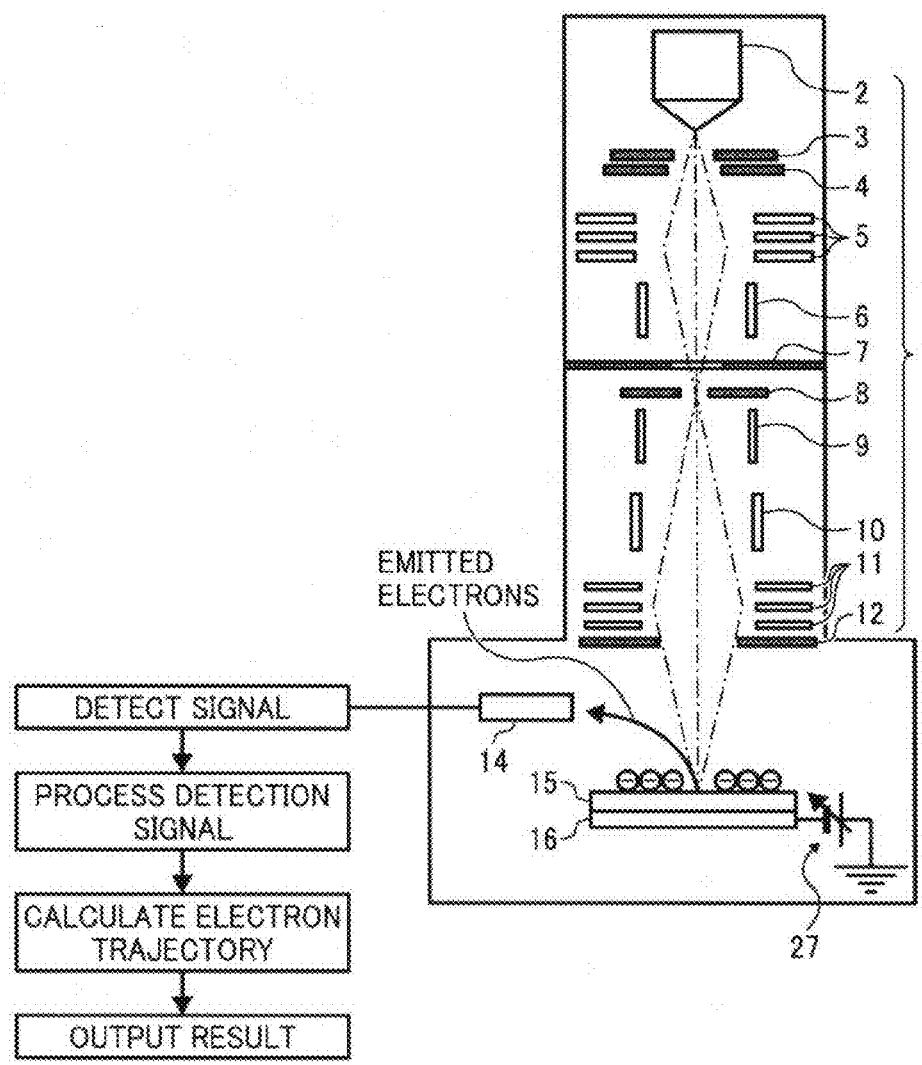
FIG. 6 is another example of the surface-potential-distribution measuring device.

FIG. 6 is another example of the surface-potential-distribution measuring device. The surface-potential-distribution measuring device of FIG. 6 is of basically similar configuration to that of FIG. 1 except for the presence of a voltage applying unit 27.

The voltage applying unit 27 includes the charged-particle emitting unit 1 that emits charged-particle beams, the exposure optical system 13, the sample setting unit 16, and the detector 14 that detects primary inverse-charged particles and secondary electrons.

The charged particles include particles that receive the influence of the electric field and magnetic field such as electron beams or ion beams.

The charged-particle emitting unit 1 also includes the electron gun 2, the extracting electrode 3, the acceleration electrode 4, the condenser lens 5, the beam blanker 6, the scanning lens (deflection electrode) 10, and the objective lens 11. The lenses are connected to a driving power source (not shown).

The electron gun 2 generates electron beams. The extracting electrode 3 controls electron beams. The acceleration electrode 4 controls energy of electron beams. The condenser lens 5 converges the electron beams from the electron gun 2. The beam blanker 6 turns on and off electron beams. Electron beams that have passed through the beam blanker 6 also passes through the scanning lens 10, and travel to the objective lens 11 as scanning beams. The objective lens 11 converges the scanning beams. The charged-particle emitting unit 1 further includes an aperture (not shown) that controls the irradiation current of electron beams. The lenses, etc. are connected to a driving power source (not shown).

In the case of the ion beams, a liquid metal ion gun is used in place of the electron gun.

As a unit that detects the primary reverse electrons, a scintillator or a photoelectron multiplier can be used.

The surface potential distribution of a sample includes both a surface potential distribution that while the sample has a surface potential distribution, the surface potential distribution is unknown, and a surface potential distribution when a surface potential is generated by charging and exposing the photoconductor.

The sample setting unit 16 at a lower part of the sample is connected with the voltage applying unit 27 that can apply a voltage ±Vsub.

Figure 7A:
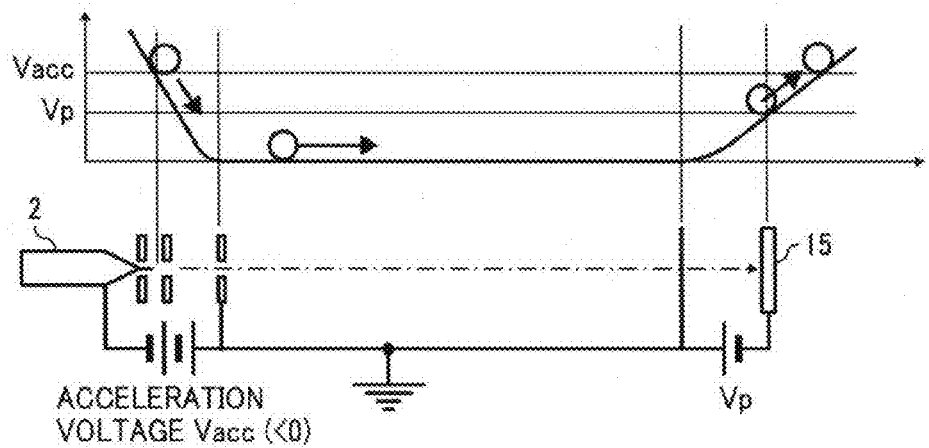
FIGS. 7A and 7B are schematic diagrams for explaining a relation between an incident electron and a sample.
Figure 7B:
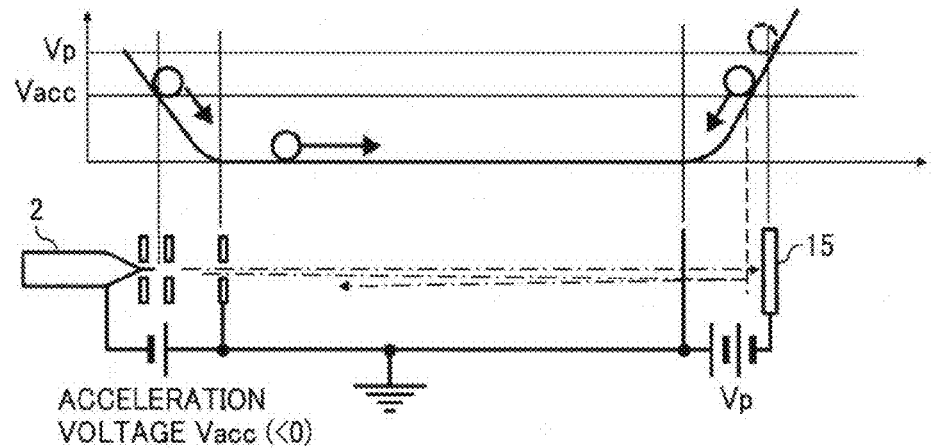

FIGS. 7A and 7B depict a relation between an incident electron and a sample. FIG. 7A depicts a state that the acceleration voltage is more than the surface potential. FIG. 7B depicts a state that the acceleration voltage is less than the surface potential.

There is an area where the acceleration or velocity vector of the charged particle incident in the direction perpendicular to the sample is reversed before the charged particle reaches the sample. The primary-incident charged particle is detected.

The acceleration voltage is usually positive, and the application voltage Vacc of the acceleration voltage is negative. In order to provide a physical meaning of potential to the acceleration voltage, the acceleration voltage is explained as being negative (Vacc<0) for convenience.

The acceleration potential of an electron beam is expressed as Vacc (<0), and the potential of the sample is expressed as Vp (<0).

Potential is electric position energy that a unit charge has. Therefore, the incident potential moves at the speed corresponding to the acceleration voltage Vacc, at the potential 0(V). That is, when a charge amount of an electron is expressed as e, and when the mass of the electron is expressed as m, the initial speed $v_0$ of the electron is expressed as $mv_0^2/2 = e \times |Vacc|$. Based on the law of energy preservation, in vacuum, an electron moves at an equal speed in the area where the acceleration voltage does not work. When the electron comes close to the surface of the sample, the potential becomes high, and the moving speed becomes slow due to the influence of the Coulomb repulsion of the sample charge.

Therefore, generally, the following phenomenon occurs.

In FIG. 7A, because $|Vacc| \div |Vp|$, the electron reaches the sample at a decreased speed. In FIG. 7B, when $|Vacc| < |Vp|$, the speed of the incident electron gradually decreases due to the influence of the potential of the sample, and the speed becomes zero before the electron reaches the sample. As a result, the electron proceeds to the opposite direction.

In vacuum having no air resistance, the law of energy preservation is completely established.

Therefore, the potential of the surface can be measured, by measuring a condition for the energy on the sample surface, or landing energy, to become substantially zero when the energy of the incident electron changes. In this case, the primary inverse-charged particle, particularly, the electron, is called a primary reverse electron. The amount of secondary electrons that are generated when the electrons reach the sample and that reach the detector is greatly different from the amount of the primary inverse-charged particles that reach the detector. Therefore, this difference can be identified from the boundary of the contrast.

The scanning electron microscope includes a reflection electron detector. In this case, the reflection electron generally refers to an incident electron that is reflected (scattered) from the back surface and flies from the surface of the sample, due to the interaction with the substance of the sample. The energy of the reflection electron matches the energy of the incident electron. The intensity of the reflection electron is higher when the atomic number of the sample is large, and is used to detect a difference of components of the sample and unevenness of the sample surface.

On the other hand, the primary reverse electron is the electron that is reversed before reaching the sample surface, due to the influence of the potential of the sample surface. Therefore, this is quite a different phenomenon from that of the reflection electron.

Figure 8:
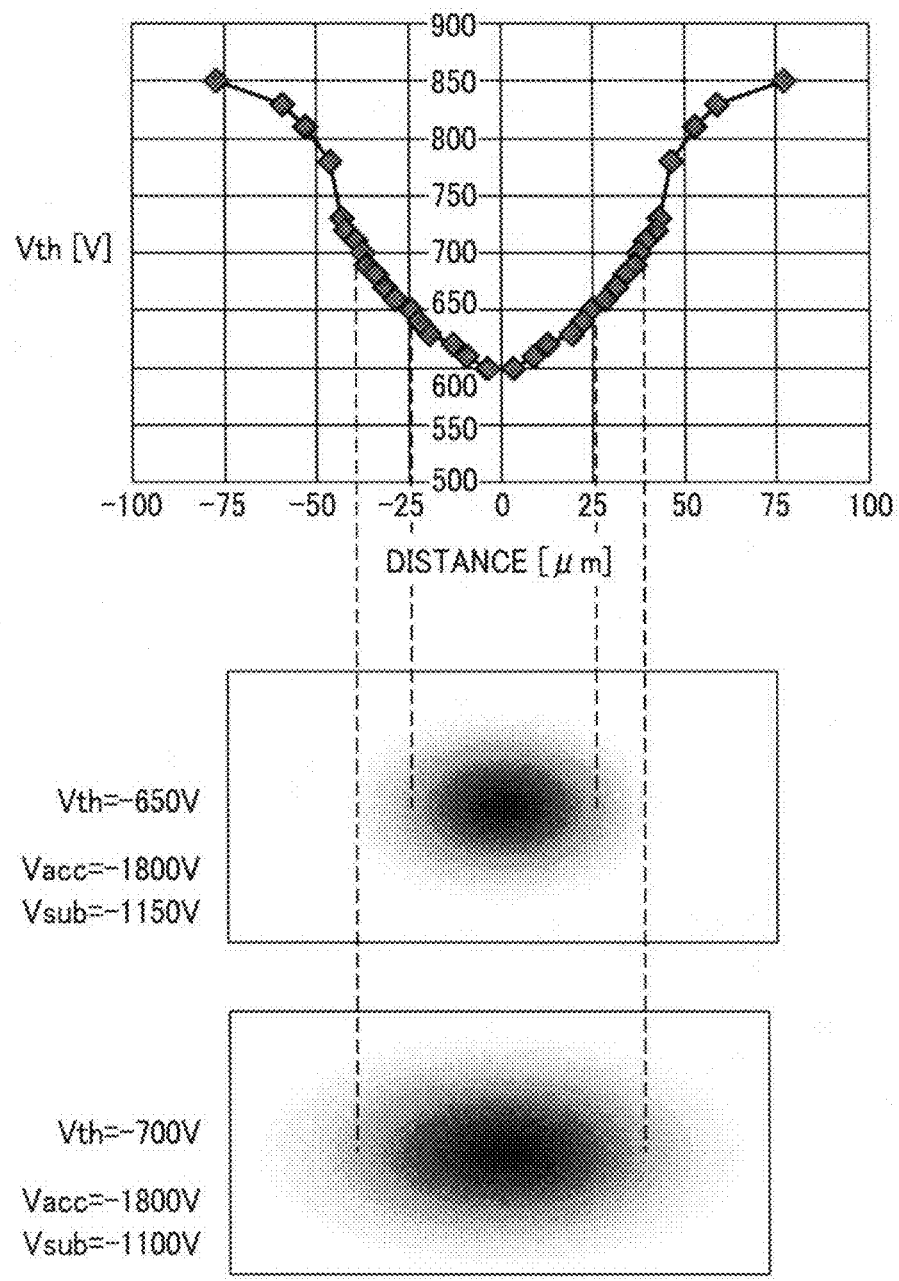
FIG. 8 is a result of measuring latent-image depth.

FIG. 8 is one example of a result of measuring latent-image depth.

When a difference between the acceleration voltage Vacc and the application voltage Vsub at the lower part of the sample at each scanning position (x, y) is expressed as Vth (=Vacc−Vsub), the potential distribution V (x, y) can be calculated by measuring Vth (x, y) when the landing energy becomes substantially zero. Incidentally, Vth (x, y) has a unique relation with the potential distribution V (x, y). When Vth (x, y) has a mild charge distribution, this charge distribution becomes approximately equal to the potential distribution V (x, y).

A curve at the upper part of FIG. 8 represents an example of the surface potential distribution generated by the charge distribution of the sample surface. The acceleration voltage of the electron gun that scans two dimensionally is set to −1,800 volts. The potential of the center (the lateral axis coordinate is 0) is about −600 volts. From the center toward the outside, the potential becomes large in the minus direction. The potential in the peripheral area in which the radius from the center exceeds 75 micrometers is about −850 volts. An ellipse in the middle of FIG. 8 represents an image of the output of the detector when the voltage of Vsub=−1,150 volts is applied to the back surface of the sample. In this case, Vth=Vacc−Vsub=−650 volts. An ellipse at the lower part of FIG. 8 represents an image of the output of the detector obtained in the same conditions as the above, except Vsub=−1,100 volts. In this case, the Vth is −700 volts.

Therefore, the surface-potential information of the sample can be obtained by measuring the Vth distribution by scanning the sample surface with electrons while changing the acceleration voltage Vacc or the application voltage Vsub. Thus, the latent-image profile can be developed into a visible image in the micron order.

Figure 9:
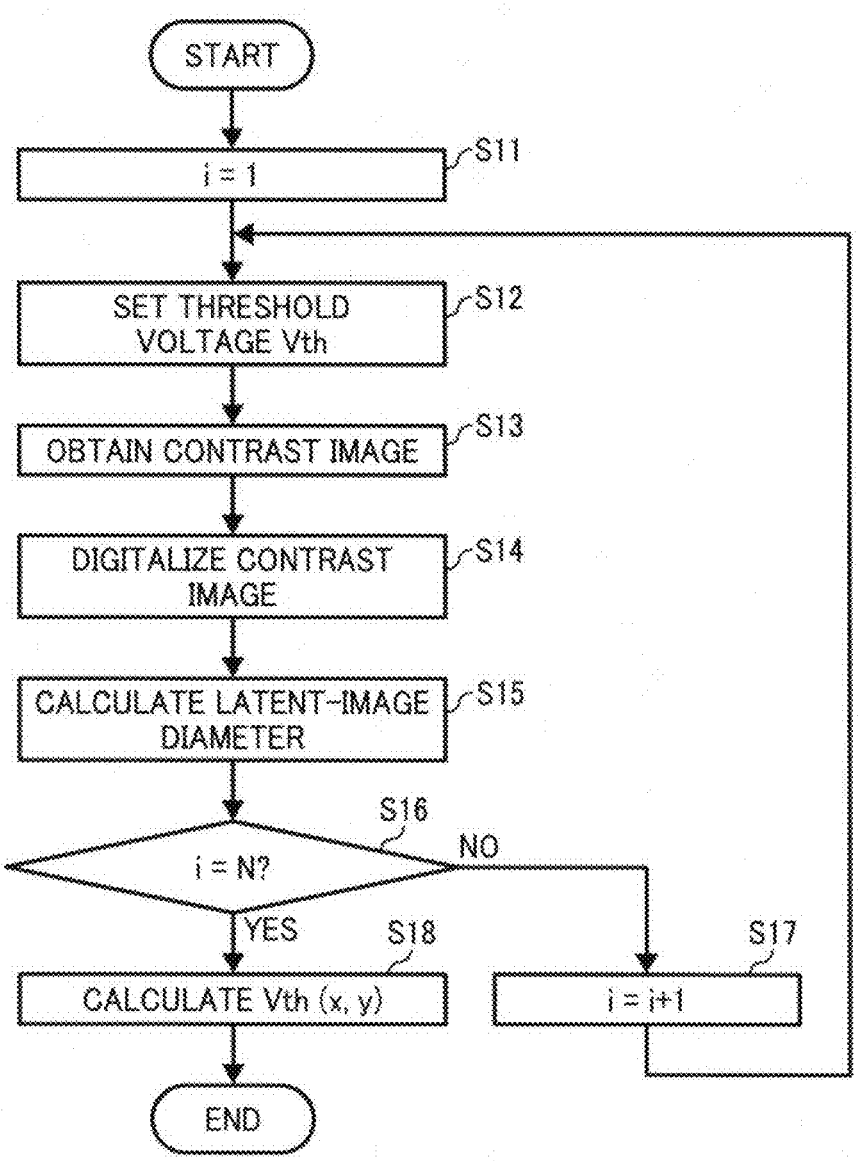
FIG. 9 is a flowchart of the process of measuring latent-image depth.

FIG. 9 is a flowchart of the process of measuring surface potential distribution to obtain the result as shown in FIG. 8.

First, a counter i of the number of times the process has repeated is initialized to 1 (step S11). Then, a threshold voltage Vth (acceleration voltage Vacc-application voltage Vsub) is set (step S12). The surface of a sample is to be measured while the acceleration voltage Vacc or the application voltage Vsub is changed.

A contrast image (see the lower part of FIG. 8) is obtained (step S13). In the contrast image, a white region represents where the detector 14 detects more secondary electrons than in a black region. An output signal from the detector 14 substantially changes at the boundary between the white region and the black region. If the acceleration voltage Vacc=−700 V, the velocity of incident electrons is higher compared with the case where the acceleration voltage Vacc=−600 V, and therefore, a region decreases where incident electrons are inverted, resulting in an increase in the black region.

The contrast image is digitalized to obtain digital data (step S14). For example, in the case of measuring surface potential distribution in the X-axis direction and the Y-axis direction, digital data is obtained with respect to the X-axis direction and the Y-axis direction.

After that, the diameter of an electrostatic latent image is calculated based on the digital data (step S15). For example, in the case of measuring surface potential distribution in the X-axis direction and the Y-axis direction, the diameter is calculated in the X-axis direction and the Y-axis direction. The diameter thus calculated is stored in a memory (not shown) in association with the threshold voltage Vth.

Then, the counter i is compared with a preset value N (N: an integer 2 or larger) (step S16). If the counter i is less than the preset value N (No at step S16), the counter i is incremented (step S17), and the process control returns to step S12 to repeat the process from step S12 to S16 until the counter i reaches the preset value N.

If the counter i matches the preset value N (Yes at step S16), the profile of surface potential distribution Vth (x, y), as an example shown in the upper part of FIG. 8, is calculated based on the data (diameter obtained by each calculation) stored in the memory (step S18).

Incidentally, the trajectory of incident electrons may curve according to the surface potential of a sample. This likely to cause a change in magnification as well as a change in the shape of a scanned area. Accordingly, charge distribution is corrected to measure surface potential distribution.

Figure 10:
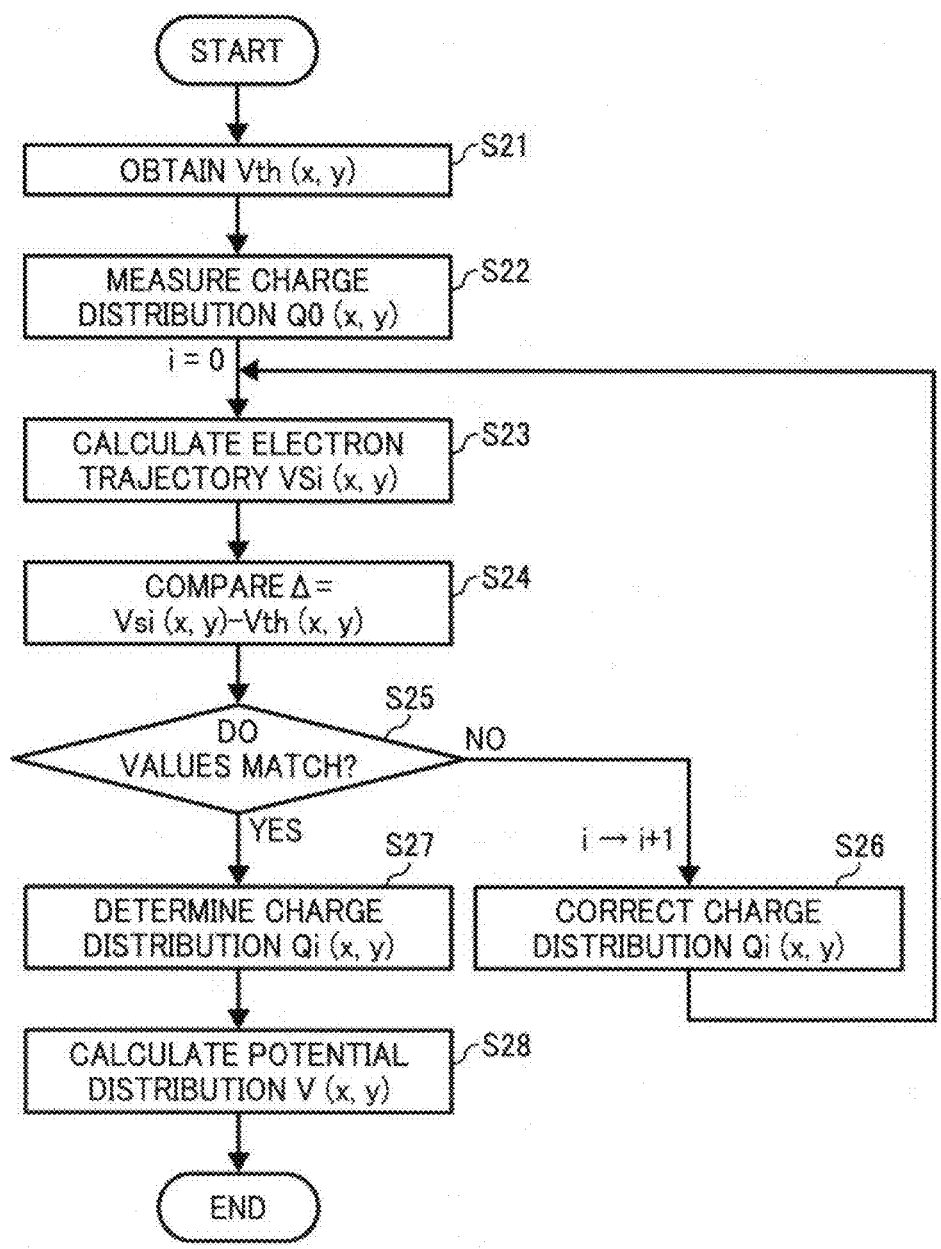
FIG. 10 is a flowchart of the process of measuring potential distribution by correcting charge distribution.

FIG. 10 is a flowchart of the process of measuring surface potential distribution by correcting charge distribution.

After the potential distribution Vth (x, y) is obtained by the process explained above in connection with FIG. 9 (step S21), a potential distribution model is created. In the example of FIG. 9, the modeling of potential distribution is performed considering various aspects such as the shape of a sample, the thickness of a charged portion (layer thickness), and the position of the detector 14. The configuration of the optical system and constituent elements thereof can further be taken into account for the modeling.

Charge distribution Q0 (x, y) is obtained at the point that the counter i is zero (i=0) (step S22). Based on the potential distribution model, an electromagnetic field is analyzed to calculate electron trajectory Vsi (x, y) at the point that the counter i is zero (step S23).

A difference between the electron trajectory Vsi (x, y) and the potential distribution Vth (x, y) is calculated with respect to predetermined evaluation points, and compared with a preset value Δ (step S24).

If the difference (Vsi (x, y)−Vth (x, y)) does not match the preset value Δ (No at step S25), the counter i is incremented to correct charge distribution Qi (x, y) (step S26). The process control returns to step S23 to repeat the process from step S23 to S25 until the difference matches the preset value Δ.

If the difference matches the preset value Δ (Yes at step S25), charge distribution Qi (x, y) is determined (step S27). Based on the result of the analysis on electron trajectory, the charge (potential) distribution model is corrected, and thus, the potential distribution V (x, y) is obtained (step S28).

Figure 11:
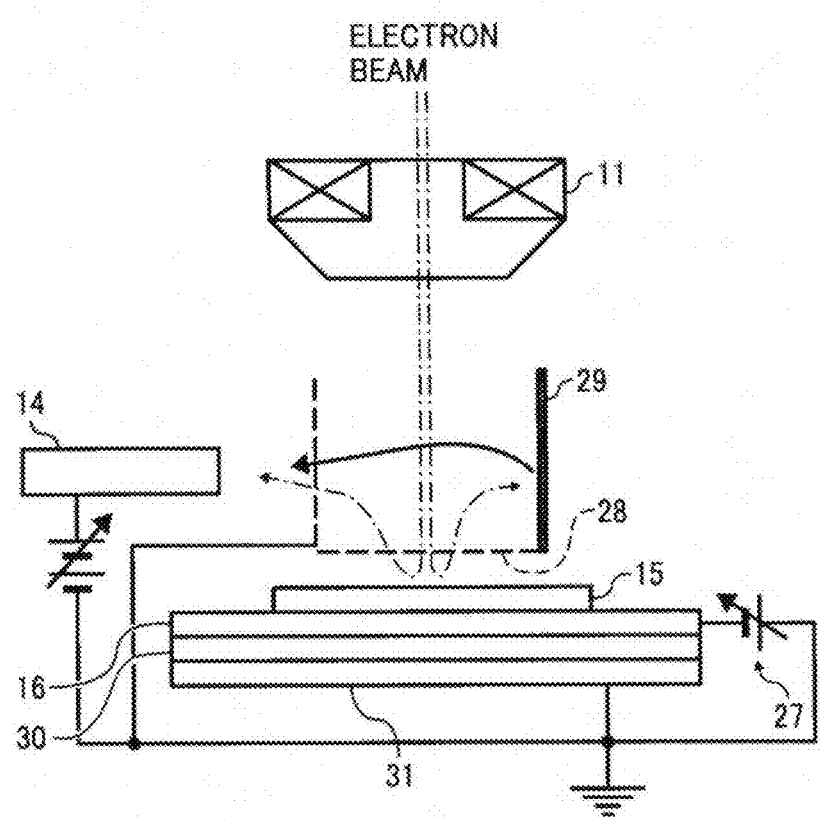
FIG. 11 is a partial view of a voltage applying unit shown in FIG. 6.

FIG. 11 is a partial view of the voltage applying unit 27. The voltage applying unit further includes a conductor board 30, and a ground board 31.

As shown in FIG. 11, with a grid mesh 28 placed above the upper surface of the sample, the trajectory of the incident electrons of the electron beams can be properly laid out. Further, by once applying the primary inverse-charged particle to a conductor board 29, the secondary electrons can be detected.

Figure 12:
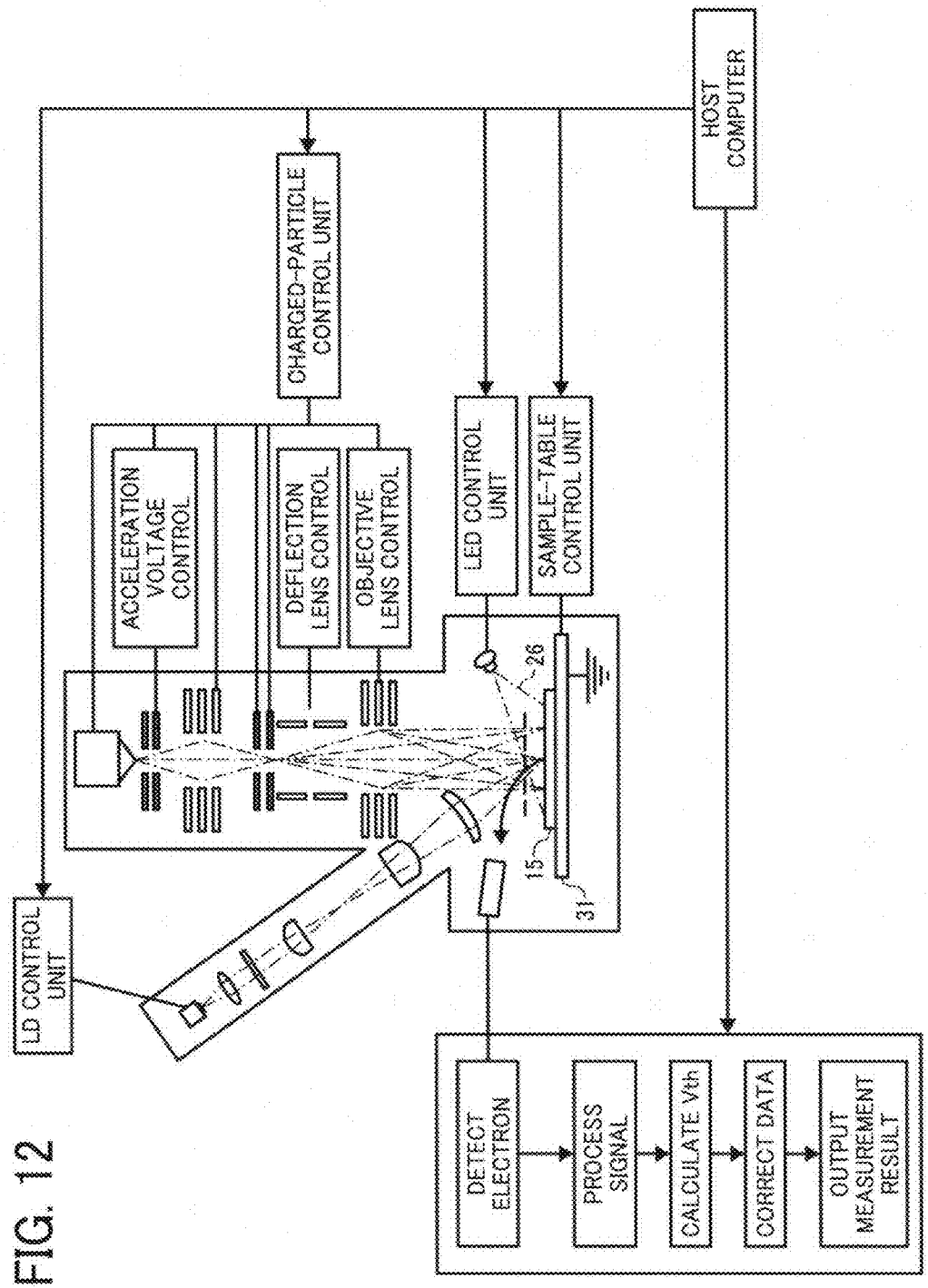
FIG. 12 is a schematic diagram of a control unit of the surface-potential-distribution measuring device.

FIG. 12 is a schematic diagram of the control unit of the surface-potential-distribution measuring device.

Charge distribution or potential distribution of the sample is modeled, and the trajectory of electron beams is calculated. Based on the trajectory of electron beams, the charge distribution model or the potential distribution model is corrected to obtain the surface potential distribution. Using this method, the potential distribution can be measured in higher precision.

Figure 13A:
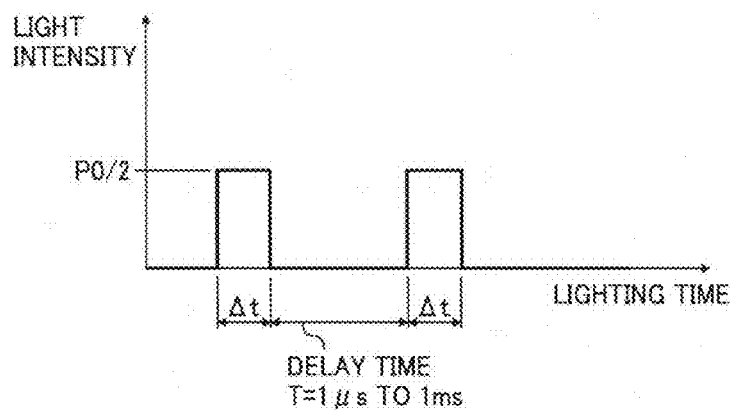
FIGS. 13A to 13C are charts for explaining the amount of change in depth of a beam-spot latent image.
Figure 13B:
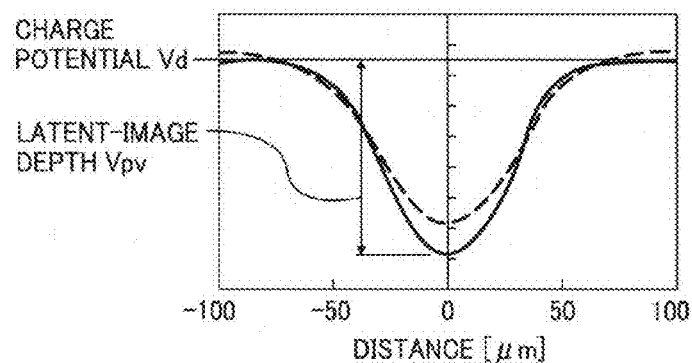
Figure 13C:
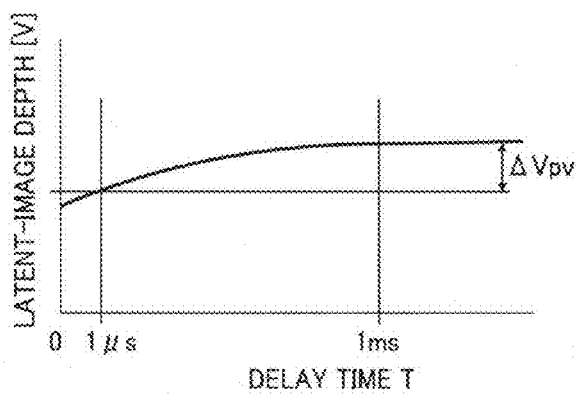

FIGS. 13A to 13C are charts for explaining the amount of change in depth of a beam-spot latent image. FIG. 13A is an example of divided exposure when the necessary energy is set as P0×Δt=constant. FIG. 13B is a chart for explaining latent-image depth. FIG. 13C is a chart for explaining a difference in latent-image depth due to a difference in delay time.

By carrying out the measurement described above, latent-image depth Vpv of one beam spot can be measured. The amount of change in latent-image depth can be measured when a delay time of a plurality of exposure times of the LD changes. In FIG. 13B, a solid-line curve expresses latent-image depth when the delay time T shown in FIG. 13A is long, and a dotted-line curve expresses latent-image depth when the delay time T is short.

When the wavelength of the writing light source is equal to or less than 680 nanometers, when the beam-spot diameter on the photoconductor surface is equal to or less than 60 micrometers, and also when the exposure energy density on the photoconductor surface is equal to or less than 4 mJ/m$^2$, the change amount ΔVpv[V] of the latent image depth of one beam-spot latent image is preferably small at the charge potential Vd[V] of the photoconductor and in the delay times of 1 microsecond and 1 millisecond. The ordinary image forming apparatus has a charge potential of a few hundred volts to 1 kilovolt in both positive and negative charges. However, when |ΔVpv/Vp|≥1, the adhesion amount of the toner is different, and the image density has the risk of becoming uneven.

When |ΔVpv/Vp|<0.1, the influence of the reciprocity failure is small, and the photoconductor can obtain high image quality, and can be regarded satisfactory.

Figure 14:
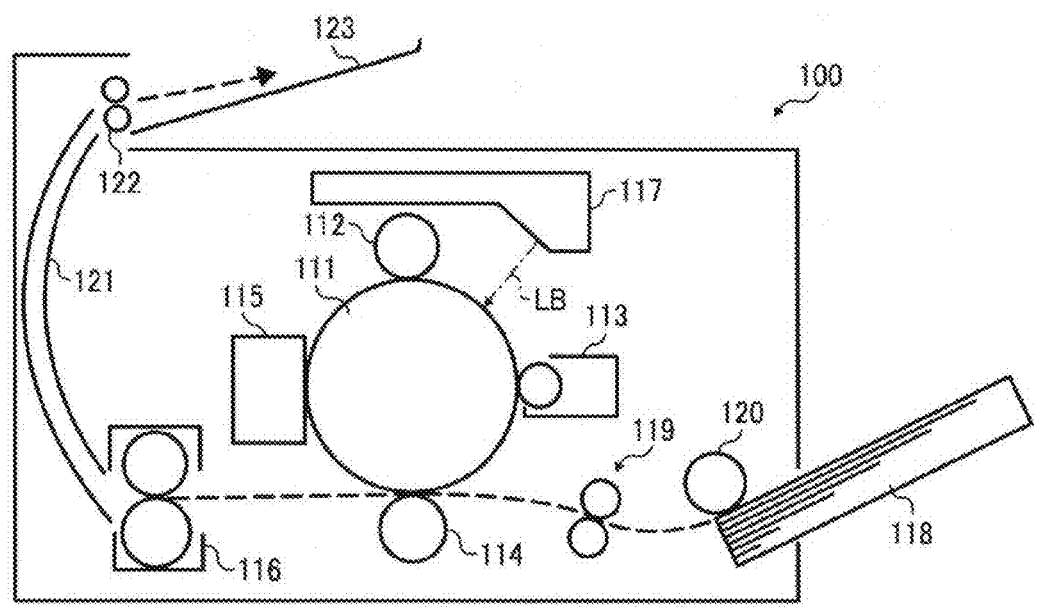
FIG. 14 is a schematic diagram of an image forming apparatus.

FIG. 14 is a schematic diagram of a laser printer 100 as an image forming apparatus according to the first embodiment. The laser printer 100 includes a "cylindrical photoconductor" as an image carrier 111. Around the image carrier ill are arranged a charging roller 112, a developing device 113, a transfer roller 114, and a cleaning device 115. While the contact-type charging roller 112 generating little ozone is used in the first embodiment, a corona charger using corona discharging can also be used. The laser printer 100 further includes a fixing device 116, an optical scanning device 117, a cassette 118, a resist-roller pair 119, a sheet-supply roller 120, a carrier path 121, a sheet-discharge roller pair 122, and a tray 123. The optical scanning device 117 carries out exposure by optical scanning with a laser beam LB between the charging roller 112 and the developing device 113. The image carrier 111 as the photoconductor rotates clockwise in FIG. 14 at a constant speed direction. Accordingly, the surface of the image carrier 111 is uniformly charged by the charging roller 112, and an electrostatic latent image is formed by optical writing of the laser beam LB of the optical scanning device 117.

The formed electrostatic latent image is what is called a "negative latent image", and the image part is exposed. This electrostatic latent image is inversely developed by the developing device 113, thereby forming a toner image on the image carrier 111. The cassette 118 that contains transfer sheets is detachably attached to the body of the image forming apparatus 100. From the cassette 118, top one of the transfer sheets is picked up by the sheet-supply roller 120. The leading edge of the transfer sheet is caught between the resist-roller pair 119. The resist-roller pair 119 supplies the transfer sheet to the transfer unit in timing with that each of the toner images on the rotating image carrier 111 comes to the transfer position. The toner images are electrostatically transferred onto the transfer sheet in a superimposed manner by the transfer roller 114 in the transfer unit. The fixing device 116 fixes the toner images on the transfer sheet. The transfer sheet with a fixed image thereon is discharged via the carrier path 121 onto the tray 123 by the sheet-discharge roller pair 122. After the toner images are transferred, the cleaning device 115 cleans the surface of the image carrier 111, thereby removing residual toners and dusts.

An electrostatic-characteristic measuring device as a latent-image measuring device according to a second embodiment of the present invention is basically similar to the surface-potential-distribution measuring device of the first embodiment shown in FIG. 1; the exposure optical system thereof is also basically similar to that of the first embodiment shown in FIG. 2.

The electrostatic-characteristic measuring device measures electrostatic characteristics of a photoconductor. The operation of the electrostatic-characteristic measuring device is explained next.

First, electron beams are irradiated onto the photoconductor (sample) 15. The acceleration voltage |Vacc| is set higher than the acceleration voltage at which the secondary-electron emission rate becomes one. With this arrangement, the amount of incident electrons exceeds the amount of discharge electrons, and therefore, electrons are accumulated in the sample 15, generating a charge up. As a result, the sample 15 can generate a uniform minus charging. A desired charge potential can be formed, by suitably setting the acceleration voltage and the irradiation time.

Next, the exposure optical system 13 exposes the photoconductor 15. The exposure optical system 13 is adjusted to form a desired beam diameter and a desired beam profile. Necessary exposure energy is a factor determined based on photoconductor characteristics, and is usually about 2 to 6 mJ/m$^2$. A photoconductor of low sensitivity requires several dozens of mJ/m$^2$ in some cases. The charge potential and the necessary exposure energy can be set to match the photoconductor characteristics and process conditions. As a result, an electrostatic latent image can be formed on the photoconductor 15. Thereafter, the amount of incident electrons is decreased to change the mode to the observation mode.

Figure 15A:
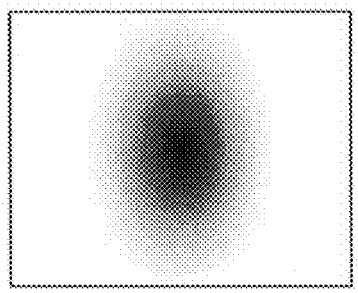
FIGS. 15A to 15C are examples of a beam spot.
Figure 15B:
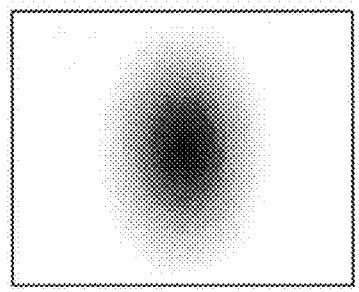
Figure 15C:
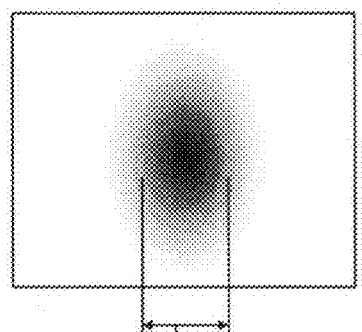
Figure 15D:
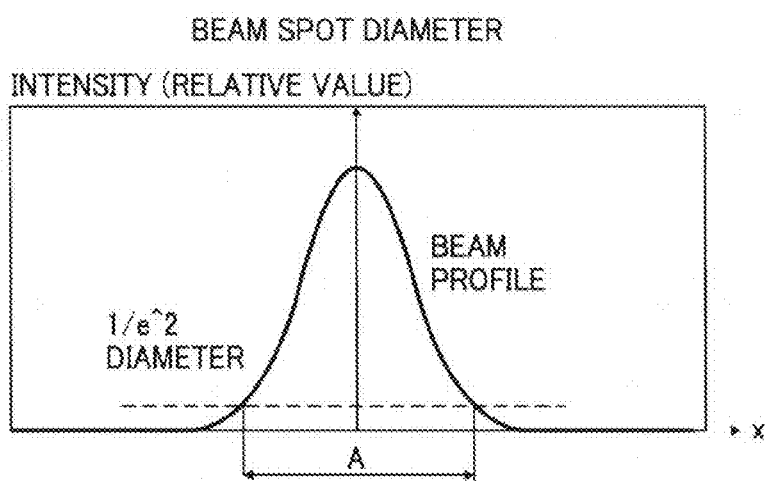
FIG. 15D is a chart of a beam-spot diameter.
Figure 15E:
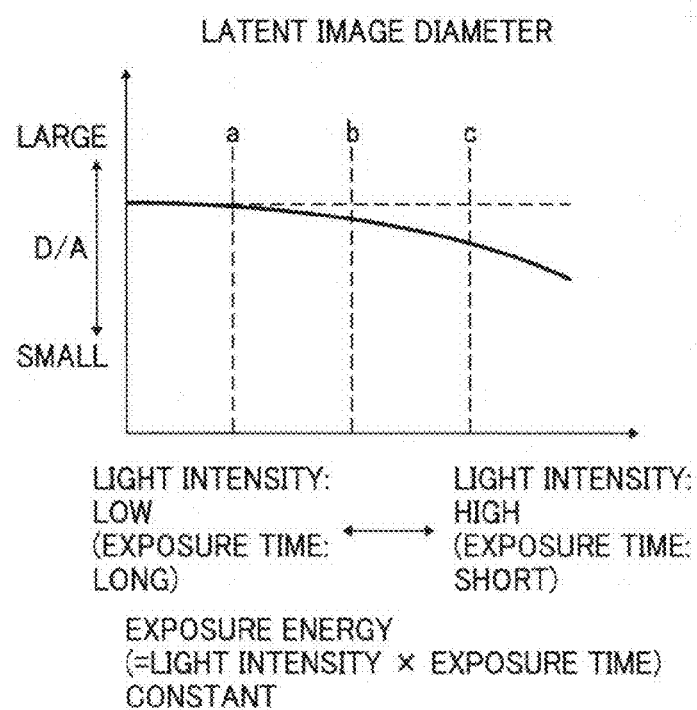
FIG. 15E is a chart of a latent-image diameter.

FIGS. 15A to 15E depict a relation between a beam-spot diameter and a latent-image diameter. FIGS. 15A to 15C depict latent-image forming areas. FIG. 15D is a profile of a beam cross section. FIG. 15E is a chart of a relation between the exposure time and the latent-image diameter.

The photoconductor 15 is scanned with electron beams. The scintillator detects the emitted secondary electrons, and converts the detected secondary electrons into an electric signal to form a contrast image. This contrast image is observed. With this arrangement, the contrast image having a small detection amount of the secondary electrons in the charged part and a small detection amount of the secondary electrons in the exposed part is generated. Because the dark part can be regarded as the latent-image part due to the exposure, the boundary of the contrast when a spot exposure is carried out without scanning beams can be set as the latent-image diameter D of the two beam-spot latent images.

When charge distribution is present on the surface of the sample, an electric field distribution is spatially formed according to the surface charge distribution. Therefore, the generated secondary electrons are pushed back by the incident electrons, and the amount of the secondary electrons reaching the detector decreases. Consequently, the exposed part of the charge-leaked position becomes black, and the non-exposed part becomes white, thereby making it possible to measure the contrast image according to the surface charge distribution.

Figure 20A:
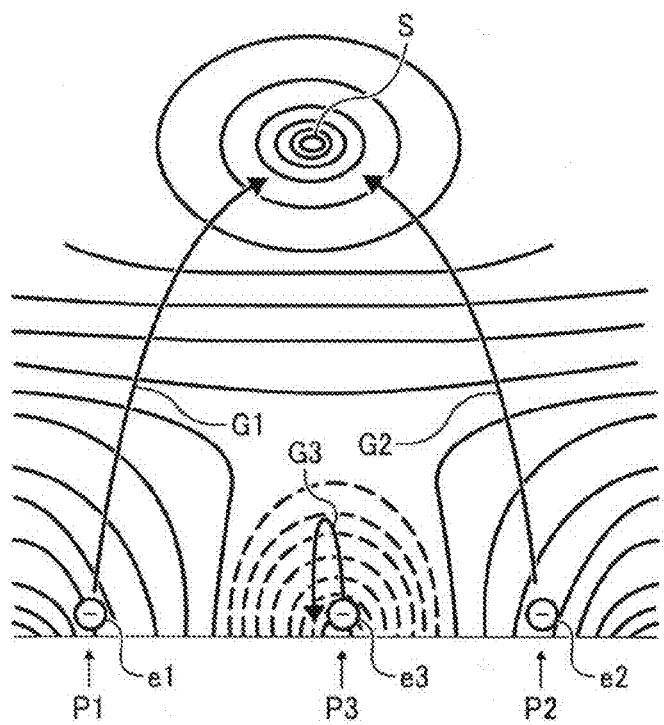
FIGS. 20A and 20B are schematic diagrams for explaining charge-distribution/potential-distribution detection using secondary electrons.
Figure 20B:
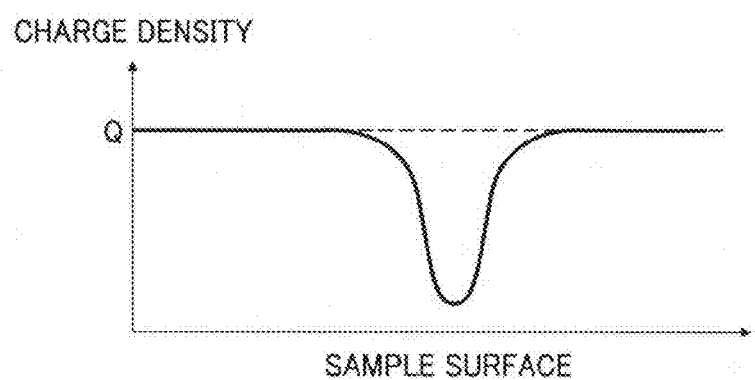
Figure 21:
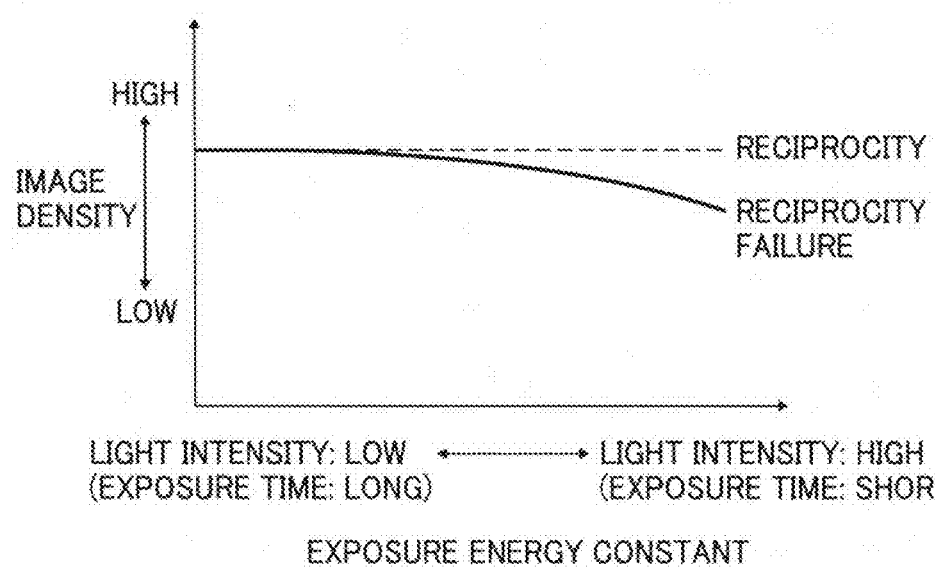
FIG. 21 is a chart for explaining reciprocity failure.
Figure 22:
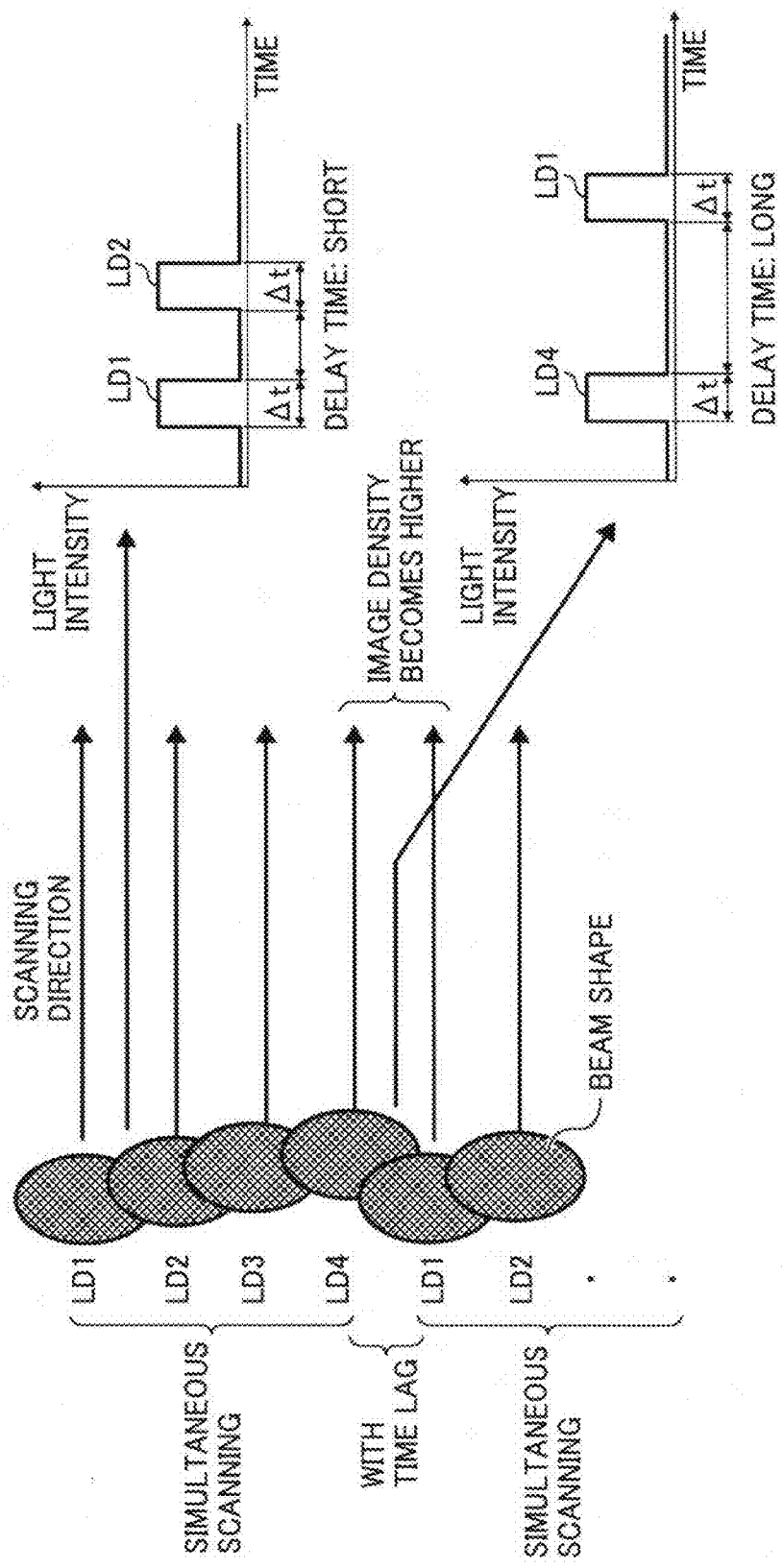
FIG. 22 is a schematic diagram for explaining image density when a 4-ch LD array is used as the scanning optical system of the image forming apparatus.

FIGS. 20A and 20B are schematic diagrams for explaining the detection of charge distribution and potential distribution.

FIG. 20A is a schematic diagram for explaining potential distribution in a space between the charged-particle collector (the detector 14) and the sample S. The surface of the sample S is uniformly charged in the negative polarity in the part other than where the potential is attenuated by optical attenuation, and potential of the positive polarity is given to the charged-particle collector. In "the potential contour lines indicated by solid lines", "the potential becomes high" toward the charge-couple collector from the surface of the sample S.

Therefore, the secondary electrons e1 and e2 generated at the points P1 and P2 of "the uniformly charged part in the negative polarity" of the sample S are pulled by the positive potential of the charged-particle collector, are displaced as indicated by the arrowheads G1 and G2, and are collected by the charged-particle collector.

On the other hand, the point P3 in FIG. 20A is "the part where the negative potential is attenuated by being optically irradiated", and the layout of the potential contour lines near the point P3 is "as shown by the broken lines". In the potential distribution of this part, "the potential becomes higher toward the point P3". That is, electric force constrained to the sample S side works in the secondary electron e3 generated near the point P3, as indicated by the arrowhead G3. Therefore, the secondary electron e3 is collected by "the hole of potential" indicated by the broken-line potential contour lines, and does not move toward the charged-particle collector.

FIG. 20B is a chart for explaining "the hole of potential" mentioned above. That is, the intensity of secondary electrons (the number of secondary electrons) detected by the charged-particle collector is as follows. The part having high intensity corresponds to "the ground part of the electrostatic latent image (uniformly negatively charged part, i.e., part represented by the points P1 and P2 in FIG. 20A)". The part having weak intensity corresponds to "the electrostatic-latent image part (optically irradiated part, i.e., part represented by the point Q3 in FIG. 20A)".

Therefore, when the signal processor 17 samples in a suitable sampling time the electric signal obtained by the detector 14, the surface potential distribution V(X,Y) can be specified for each "fine area corresponding to the sampling", using the sampling time T as a parameter, as described above. The signal processor 17 can structure the surface potential distribution (potential contrast image) V(X,Y) as two-dimensional image data. The output device outputs the two-dimensional image data, and obtains the electrostatic latent image as the visible image.

When the intensity of the collected secondary electrons is "expressed as the contrast of brightness", the electrostatic-latent image part becomes dark, and the ground part becomes bright, thereby forming a contrast. As a result, the contrast image corresponding to the surface charge distribution can be expressed (output). When the surface potential distribution is known, the surface charge distribution can be also known.

With this configuration, the photoconductor can be highly durable while achieving high image quality, by accepting the electrostatic characteristics of the photoconductor, by measuring the latent image state while the exposure condition is changed, in the method of measuring a state of the charge distribution or the potential distribution of the sample from the detection signal obtained by irradiating charged-particle beams to the sample having the surface charge distribution or the surface potential distribution.

When the reciprocity law is established, the exposure energy equals the image-surface light intensity per unit area times the exposure time. Therefore, when the exposure energy density is constant, the electrostatic latent image does not change. However, when the reciprocity error phenomenon is present, the latent-image diameter and the latent-image depth are greatly different in the long exposure-time condition, even when "image-surface light intensity per unit area"×"exposure time"="exposure energy density". This is because when the light intensity is high, the recombination amount of carriers increases, and the amount of carriers reaching the surface decreases.

The reciprocity failure phenomenon also changes depending on the photoconductor material and the CGL film thickness. Therefore, the relation between the writing condition and the photoconductor needs to be understood in advance. When conditions within the same type of device are changed, the relation needs to be corrected.

First, the image-surface light intensity per unit area and the exposure time are set so that the exposure energy density becomes constant. For example, when the exposure energy density is 4 mJ/m$^2$, the image-surface light intensity per unit area is 4,000 W/m$^2$ and the exposure time is 1 microsecond, the image-surface light intensity per unit area is 2,000 W/m$^2$ and the exposure time is 1 microsecond, and the image-surface light intensity per unit area is 1,000 W/m$^2$ and the exposure time is 4 microseconds. Other conditions (beam-spot diameter and photoconductor) are fixed, and the electrostatic latent image is visually measured by detecting secondary electrons according to the method described above (FIGS. 15A to 15C). The latent-image diameter D is calculated for each condition from the visible image.

The radio of A/D is calculated when the exposure beam-spot diameter (1/e$^2$ diameter) is A. The graph shown in FIG. 15E is obtained from the change of the latent-image diameter. A change amount of the latent-image diameter corresponding to the image-surface light intensity can be accepted, and the reciprocity error phenomenon can be measured.

With this configuration, the latent-image diameter of one beam-spot latent image is measured when the exposure energy density is fixed and when the image-surface light intensity per unit area is changed. With this arrangement, a mechanism of the reciprocity error can be analyzed. As a result, the cause of the occurrence of uneven image density can be found, and countermeasures can be implemented. Consequently, the output image quality can be improved.

The state of the latent image changes when only the light emitting pattern of the LD is changed. Examples of the light emitting patterns by the LD are as shown in FIGS. 3A to 3D. The same optical system is used, and other conditions than the LD-light emitting patterns are the same. That is, the same area is exposed repeatedly a plurality of times.

As described above, it can be seen that delay time is zero in the emitting pattern shown in FIG. 3A, and delay time is Δt in the emitting pattern shown in FIG. 3B. While the exposure energy per unit area of the sample is constant for the emitting patterns shown in FIGS. 3A to 3D, states of latent images are different due to the influence of reciprocity failure. The influence of reciprocity failure can be measured by measuring a change of latent-image depth during a delay time of a plurality of pulses.

Higher-precision measuring can be carried out by measuring the profiles of the surface charge distribution and the surface potential distribution.

The configuration of this electrostatic-characteristic measuring device is basically similar to that shown in FIG. 6. A relation between incident electrons and the sample is as previously described in connection with FIGS. 7A and 7B.

The scanning electron microscope includes a reflection electron detector. Reflection electrons generally refer to incident electrons that are reflected (scattered) on the back surface and fly from the surface of the sample due to the interaction with the substance of the sample. The energy of the reflection electron matches the energy of the incident electron. The intensity of the reflection electron is higher when the atomic number of the sample is large, and is used to detect a difference of components of the sample and unevenness of the sample surface.

On the other hand, the primary reverse electron is the electron that is reversed before reaching the sample surface due to the influence of the potential of the sample surface. Therefore, this is quite a different phenomenon from that of the reflection electron.

When a difference between the acceleration voltage Vacc and the application voltage Vsub at the lower part of the sample at each scanning position (x, y) is expressed as Vth (=Vacc−Vsub), the potential distribution V (x, y) can be measured by measuring Vth (x, y) when the landing energy becomes substantially zero. Incidentally, Vth (x, y) has a unique relation with the potential distribution V (x, y). When Vth (x, y) has a mild charge distribution, this charge distribution becomes approximately equal to the potential distribution V (x, y).

Therefore, the surface-potential information of the sample can be obtained by measuring the Vth distribution by scanning the sample surface with electrons while changing the acceleration voltage Vacc or the application voltage Vsub. An example of a result of measuring latent-image depth is as shown in FIG. 8, and the process of measuring latent-image depth is performed as previously explained in connection with FIG. 9. When the above method is used, the latent-image profile can be developed into a visible image in the micron order, which it has been difficult to achieve so far.

The trajectory of electron beams is calculated by modeling the charge distribution or the potential distribution of the sample in advance. Based on the trajectory of the electron beams, the charge distribution model or the potential distribution model is corrected to obtain the surface potential distribution. Based on this method, the potential distribution can be measured in higher precision (see FIG. 10).

Thus, the mechanism of the reciprocity failure can be analyzed by changing the light emitting time with fixed exposure energy density.

As described above, when the delay time becomes long, the latent-image potential tends to be formed deep, and changes in the S-shaped curve along the delay time, as a whole. That is, the state of the latent-image formation on the photoconductor is different depending on the delay time when light is emitted a plurality of times with the constant light intensity and irradiation time. Therefore, the operation is carried out as follows to arrange the state of the latent image formation on the photoconductor (see FIGS. 16A to 16D).

Figure 16A:
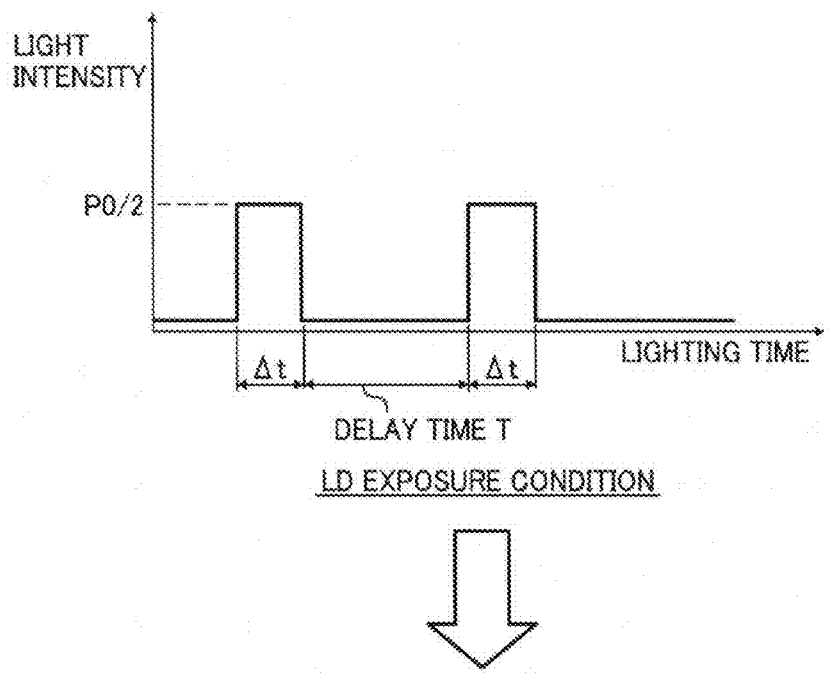
FIG. 16A is an example of an LD-light emitting pattern in the case of two exposures with a delay time T.
Figure 16B:
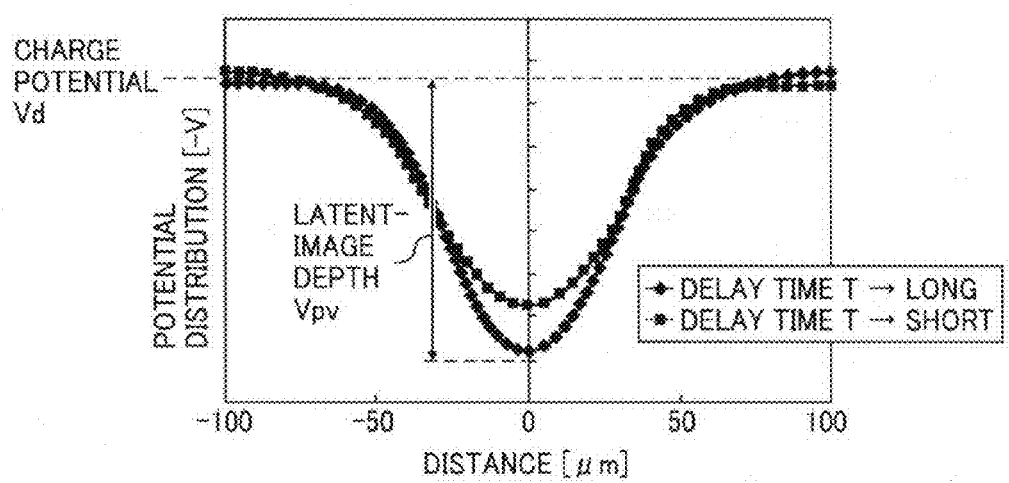
FIG. 16B is a chart of latent-image depth.

The operation is explained for the case where exposure is carried out twice, with the delay time T (see FIG. 16A).

Figure 16C:
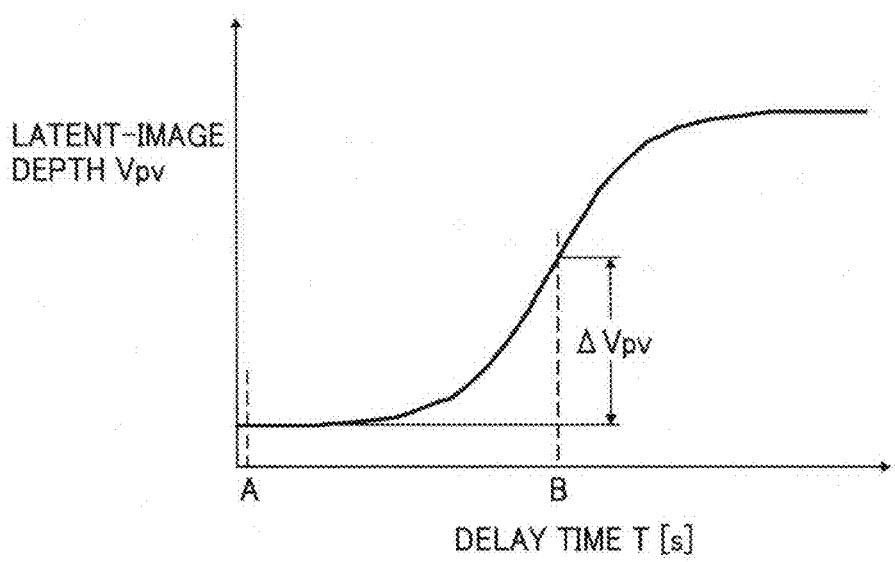
FIG. 16C is a chart of a relation between latent-image depth and delay time.
Figure 16D:
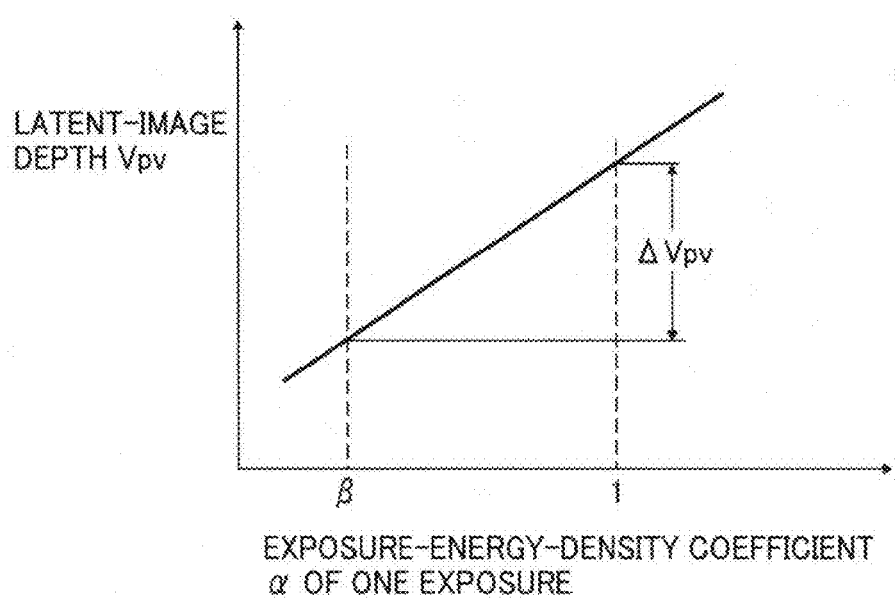
FIG. 16D is a chart of a relation between latent-image depth and an exposure-energy density coefficient α in the case of one exposure.

First, latent-image depth is measured when the exposure energy density is Ed (condition A shown in FIG. 16C). The latent-image depth refers to a difference between the charge potential and the bottom potential (see FIG. 16B).

A depth of the latent-image potential is measured, by irradiating the sample twice with the delay time T in one half of the exposure energy density ½×Ee (condition B shown in FIG. 16C).

Latent-image depth change amount $\Delta$Vpv is calculated under conditions A and B. The latent-image depth is measured with different exposure-energy density coefficients $\alpha$ at the exposure energy density $\alpha \times$Ee for one exposure (see FIG. 16D). When $\alpha=1$, the exposure energy density becomes the total exposure energy density for two exposures.

A coefficient $\beta$ when the latent-image-depth change amount becomes $\Delta$Vpv when the exposure-energy density coefficient $\alpha$ has changed is calculated. That is, when the two exposures are carried out with the delay time T under the condition of ½×$\beta$×Ee, the same latent-image depth as that when one exposure is carried out in Ee is formed. Because the latent-image potential becomes higher when the exposure is carried out twice, the coefficient $\beta$ becomes equal to or smaller than one.

As explained above, the state of a latent-image obtained by a plurality of exposures with a delay time can be matched with that by one exposure. Thus, an electrostatic latent image can be measured in the case of a plurality of exposures similarly to the case of one exposure.

With this configuration, it is possible to analyze the influence to the image density attributable to the reciprocity failure phenomenon, by converting the change amount of the latent-image depth when the delay time of a plurality of exposures changes into the change amount of the latent-image depth when the exposure energy density of one exposure changes. By feeding back a measured electrostatic latent image of the photoconductor to the design, the process quality of each step is improved. Therefore, high image quality, high durability, high stability, and energy saving can be achieved.

Figure 17:
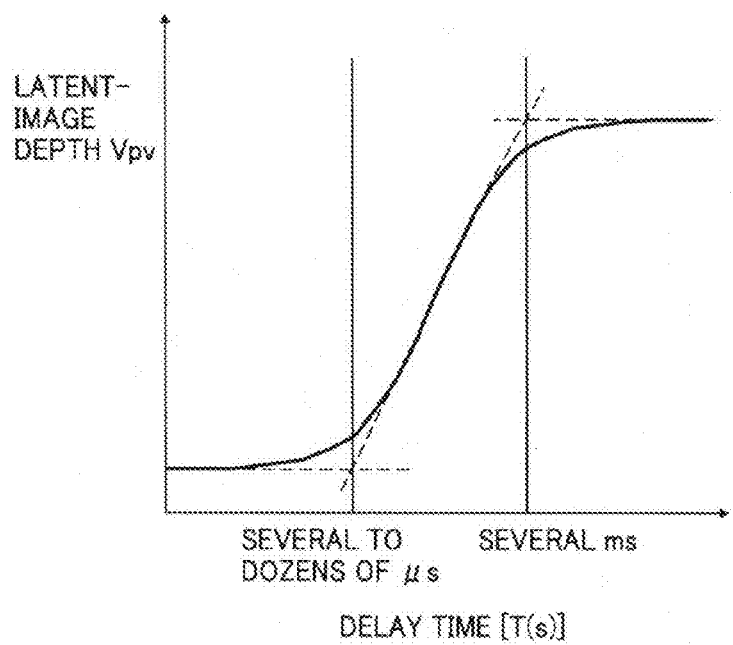
FIG. 17 is a chart of latent-image depth that changes in an S-shaped curve with delay time.
Figure 18:
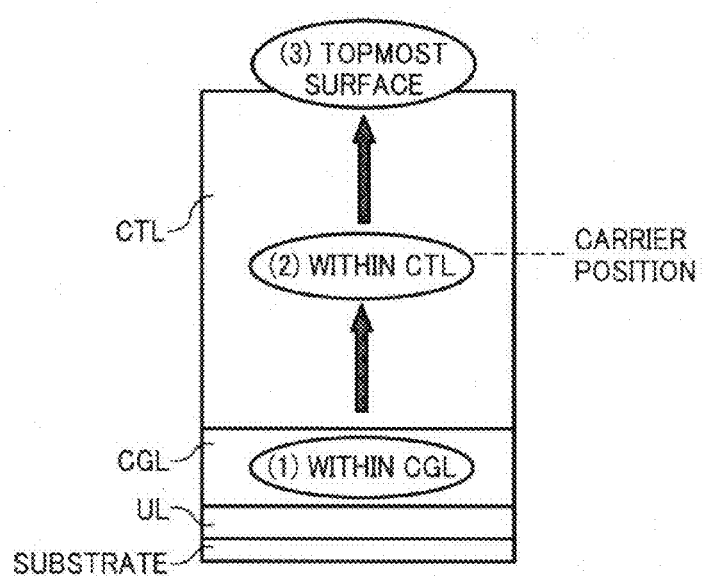
FIG. 18 is a schematic diagram for explaining a relation between latent-image depth and a carrier position.

The phenomenon that the latent-image depth changes in the S-shaped curve relative to the delay time is relevant to a carrier position generated at the first exposure in the second exposure (see FIGS. 17 and 18).

During the moving time within the charge generation layer (CGL) (a few to dozens of microseconds), carriers that are generated at the first time and the second time coexist in the CGL. Therefore, the recombination condition becomes substantially constant without depending on time.

In the range of the delay time during the move within a charge transportation layer (CTL) (dozens of microseconds to a few milliseconds), the latent image is formed deep when the delay time becomes long. This is because the recombination amount following the move of the carriers within the CTL decreases. The CGL field intensity changes at the first carrier position, and the quantum efficiency at the second exposure (generation amount of carriers) changes.

When the delay time is a few milliseconds or more, the carrier position remains unchanged after reaching the topmost surface. Therefore, the generation amount of carriers and the recombination amount do not change, and the latent-image depth becomes constant.

Therefore, when the latent-image depth is measured by changing the delay time, the moving state of the generated carriers can be measured. That is, it can be determined that the rise of the above S-shaped curve becomes sharp for the first time when the move of the generated carriers changes from the CGL to the CTL, and that the rise of the S-shaped curve becomes mild and constant when the generated carriers reach the topmost surface.

When the moving time of the generated carries is understood, the mobility of the carriers within the CTL can be calculated. Assume that the film thickness of the CTL is expressed as L, the mobility in the CTL is expressed as µ (carrier moving distance/(unit time and unit field)), and the charge potential is expressed as Vs. The following relation is obtained: $\mu=L/T*E=L^2/|(T \times Vs)|$.

Therefore, when Vs equals −800 volts, when T equals 3 milliseconds, and when L equals 30 micrometers, the 1.1 can be calculated as follows: $\mu=(30*10^{-6})^2/|3*10^{-3})/(-800)|=0.375*10^{-9}(m^2/V\cdot t)$.

With this configuration, the latent-image depth is measured by changing the delay time when exposure is carried out a plurality of times, and the moving state of the generated carriers is measured. With this arrangement, material characteristics that affect the latent-image formation on the photoconductor can be understood. Further, charging and exposure times and developing time can be set properly.

Further, the latent-image depth is measured by changing the delay time when exposure is carried out a plurality of times, and the moving time of the generated carriers from the CGL to the CTL is measured. With this arrangement, mobility of carriers within the CGL can be measured, which it has been difficult to achieve because of the thin film according to the conventional technique. Further, charging and exposure times and developing time can be set properly.

Further, the latent-image depth is measured by changing the delay time when exposure is carried out a plurality of times, and the moving time of the generated carriers reaching the surface is measured. With this arrangement, mobility of carriers within the CTL can be measured. As a result, the electrophotographic process conditions such as charging and exposure times and developing time can be set properly.

When the above result is used for the optical scanning device having a plurality of light sources, an optical scanning device can be obtained which corrects to offset the change amount of the latent-image depth generated in the delay time corresponding to the scanning interval time of the polygon. Assume that the rotation number of the polygon motor is R=40,000 rpm and that the number of polygon planes is N=6. The time required to scan one plane to the next plane is then calculated as 1/R/N*60(s)=/40000/6*60=250 microseconds. Therefore, the delay time corresponding to the scanning interval time of the polygon becomes 250 microseconds. Accordingly, the image of the boundary becomes the electrostatic latent image when exposure is carried out twice with the delay time 250 microseconds. The electrostatic latent image is formed deep due to the influence of the reciprocity failure. As a result, the image of high concentration is obtained. To obtain the same concentration, the correction coefficient β is calculated as shown in FIGS. 16A to 16D, and the light intensity is corrected to be decreased by the correction amount.

That is, the relation between the latent-image depth and the delay time is calculated in advance, and output light intensity from the LD light source is corrected. When the change amount of the latent-image depth is within 10% of the latent-image depth, the difference of concentration is not easily identifiable. Therefore, the correction is preferably within this range. That is, when the latent-image depth is 250 volts, the permissible value is equal to or less than 25 volts.

Figure 19A:
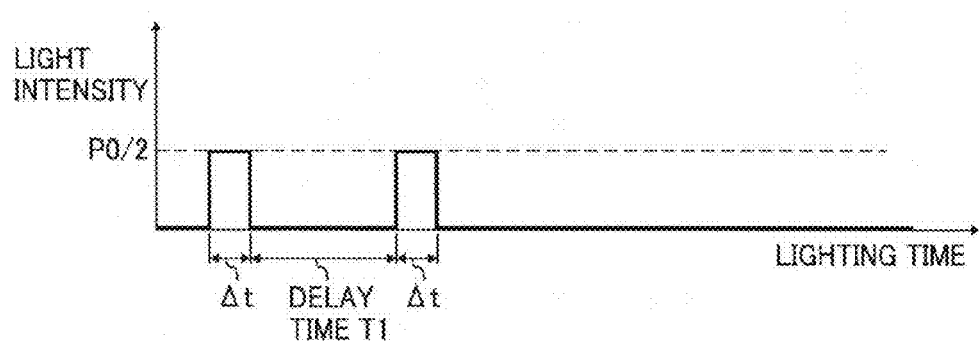
FIGS. 19A and 19B are examples of LD-light-intensity control patterns in a multi-beam-scanning optical system.
Figure 19B:
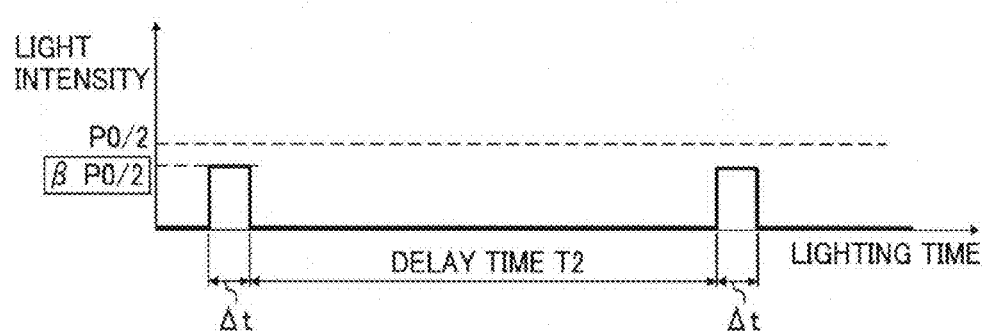

FIGS. 19A and 19B are examples of the LD-light emitting patterns. The above configuration can be effectively applied to a multi-beam scanning optical system to overcome the reciprocity failure phenomenon that appears when exposure is carried out three or more times in achieving high picture quality.

As shown in FIG. 4A, light beams emitted from the light source including the semiconductor laser are deflected by the polygon mirror via the cylinder lens. The light beams are focused via a scanning lens and a reflecting mirror to form an image on the photoconductor as the scanned medium. Printing data for one line corresponding to each light-emitting point is stored in the buffer memory within the image processing device that controls the light emitting signal at each light-emitting point. The printing data is read for each one deflection/reflection plane of the polygon mirror, and light beams flicker corresponding to the printing data on the scanning lines on the scanned medium. As a result, the electrostatic latent image is formed following the scanning lines.

As shown in FIG. 4B, a semiconductor laser array having four light sources is arranged in the vertical direction of the optical axis of a collimate lens.

FIG. 4C is a schematic diagram of the light source of the optical scanning device including a surface light-emitting laser having light emitting points arranged on a plane in the X-axis direction and the Y-axis direction. With this configuration example, the surface light-emitting laser has 12 light-emitting points, i.e., three light-emitting points in the horizontal direction (main scanning direction), and four light-emitting points in the vertical direction (sub-scanning direction). When this configuration is applied to the optical scanning device shown in FIG. 4A, four scanning lines in the vertical direction can be scanned simultaneously, using three light sources placed on one scanning line in the horizontal direction.

As explained above, this configuration can be effectively applied to a multi-beam scanning optical system to overcome the reciprocity failure phenomenon that appears when exposure is carried out a plurality of times, thus enabling high-precision and high-speed optical scanning becomes possible.

With this configuration, when the LD is controlled so that the electrostatic latent image becomes constant, by considering the delay time and exposure energy of polygon scan, a high image-quality and highly durable output image can be obtained. Besides, a high-quality image can be formed without variation in image density even if the image forming apparatus has an imaging system with reciprocal failure.

The latent-image carrier described above provides an imaging system with little reciprocal failure. Thus, an image forming apparatus can be manufactured that is capable of forming a high-quality image without variation in image density with excellent resolution, high-precision, high durability, and high reliability.

As set forth hereinabove, according to an embodiment of the present invention, it is possible to measure in high resolution in a micron order charge distribution or potential distribution generated on the surface of a photoconductor.

Moreover, charged-particle beams are irradiated to a sample having a surface charge distribution or a surface potential distribution. Based on a detection signal obtained by the irradiation, a latent-image state obtained by exposing the sample a plurality of times is measured, at the time of measuring the charge distribution or the potential distribution of the sample. With this arrangement, the mechanism of reciprocity failure can be analyzed.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A latent-image carrier having a surface that is uniformly charged and exposed to form an electrostatic latent image thereon, the latent-image carrier satisfies, when the surface is exposed a plurality of times to light beams having a wavelength equal to or less than 680 nanometers, $$|\Delta D/A| < 0.2$$

where A is a diameter of a beam spot on the surface and is equal to or less than 60 micrometers, and $\Delta D$ is a difference in latent-image diameter corresponding to the beam spot between when a time interval at which the surface is exposed is 1 microsecond and when the time interval is 1 millisecond.

2. The latent-image carrier according to claim 1, wherein the latent-image carrier further satisfies, when exposure energy density is equal to or less than 4 mJ/m$^2$, $$|\Delta Vpv/Vd| < 0.1$$

where Vd is a potential to which the surface is charged, and $\Delta Vpv$ is a difference in latent-image depth corresponding to the beam spot between when a time interval at which the surface is exposed is 1 microsecond and when the time interval is 1 millisecond.

* * * * *